United States Patent
Yeom et al.

(10) Patent No.: US 12,211,941 B2
(45) Date of Patent: Jan. 28, 2025

(54) SEMICONDUCTOR DEVICE WITH CHANNEL PATTERN FORMED OF STACKED SEMICONDUCTOR REGIONS AND GATE ELECTRODE PARTS

(71) Applicant: SAMSUNG ELECTRONICS CO., LTD., Suwon-si (KR)

(72) Inventors: Donghyuk Yeom, Seoul (KR); Junkyum Kim, Pohang-si (KR); Kwan Heum Lee, Suwon-si (KR); Seonghwa Park, Seoul (KR); Sohyun Seo, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 373 days.

(21) Appl. No.: 17/327,725

(22) Filed: May 23, 2021

(65) Prior Publication Data

US 2022/0173253 A1  Jun. 2, 2022

(30) Foreign Application Priority Data

Dec. 1, 2020 (KR) .................. 10-2020-0165549

(51) Int. Cl.
*H01L 29/786* (2006.01)
*H01L 21/02* (2006.01)
(Continued)

(52) U.S. Cl.
CPC .... *H01L 29/78696* (2013.01); *H01L 21/0259* (2013.01); *H01L 21/823807* (2013.01);
(Continued)

(58) Field of Classification Search
CPC .......... H01L 29/78696; H01L 21/0259; H01L 21/823807; H01L 21/823814; H01L 21/823864; H01L 21/823871; H01L 27/092; H01L 29/0665; H01L 29/41733; H01L 29/42392; H01L 29/66545; H01L 29/66553; H01L 29/66742; H01L 29/78618; H01L 21/82385; H01L 29/165;
(Continued)

(56) References Cited

U.S. PATENT DOCUMENTS 9,362,355 B1 *  6/2016  Cheng ................ H01L 29/4991
9,837,410 B1 * 12/2017  Cheng ............... H01L 29/78618
(Continued)

*Primary Examiner* — Jami Valentine Miller
*Assistant Examiner* — Pratiksha Jayant Lohakare
(74) *Attorney, Agent, or Firm* — Sughrue Mion, PLLC

(57) ABSTRACT

A semiconductor device includes; an active pattern on a substrate, a source/drain pattern on the active pattern, a channel pattern connected to the source/drain pattern and including semiconductor patterns spaced apart in a vertical stack, and a gate electrode extending across the channel pattern. The semiconductor patterns includes a first semiconductor pattern and a second semiconductor pattern. The gate electrode includes a first part between the substrate and the first semiconductor pattern and a second part between the first semiconductor pattern and the second semiconductor pattern. A width of the first part varies with a depth of the first part, such that a width of a middle portion of the first part is less than a width of a lower portion of the first part and a width of an upper portion of the first part.

20 Claims, 36 Drawing Sheets

(51) Int. Cl.
*H01L 21/8238* (2006.01)
*H01L 27/092* (2006.01)
*H01L 29/06* (2006.01)
*H01L 29/417* (2006.01)
*H01L 29/423* (2006.01)
*H01L 29/66* (2006.01)

(52) U.S. Cl.
CPC ........... *H01L 21/823814* (2013.01); *H01L 21/823864* (2013.01); *H01L 21/823871* (2013.01); *H01L 27/092* (2013.01); *H01L 29/0665* (2013.01); *H01L 29/41733* (2013.01); *H01L 29/42392* (2013.01); *H01L 29/66545* (2013.01); *H01L 29/66553* (2013.01); *H01L 29/66742* (2013.01); *H01L 29/78618* (2013.01)

(58) Field of Classification Search
CPC .......... H01L 29/7848; H01L 27/088; H01L 29/41725; H01L 29/42356; H01L 21/823828; H01L 21/823857; H01L 29/0673
USPC ....................................................... 257/351
See application file for complete search history.

(56) References Cited

U.S. PATENT DOCUMENTS

| | | | |
|---|---|---|---|
| 9,991,352 B1* | 6/2018 | Frougier | H01L 29/42364 |
| 10,269,983 B2 | 4/2019 | Frougier et al. | |
| 10,312,350 B1 | 6/2019 | Cheng et al. | |
| 10,424,651 B2 | 9/2019 | Cheng et al. | |
| 10,490,654 B2* | 11/2019 | Chuang | H01L 21/308 |
| 10,522,554 B2* | 12/2019 | Liaw | H01L 29/42392 |
| 10,553,696 B2 | 2/2020 | Ando et al. | |
| 10,566,330 B2 | 2/2020 | Rodder et al. | |
| 10,580,860 B2 | 3/2020 | Kim et al. | |
| 10,658,461 B2 | 5/2020 | Chang et al. | |
| 10,797,163 B1* | 10/2020 | Yu | H01L 29/66439 |
| 2018/0219095 A1* | 8/2018 | Huang | H01L 29/66795 |
| 2018/0294331 A1* | 10/2018 | Cho | H01L 29/0649 |
| 2019/0109144 A1* | 4/2019 | Liaw | H01L 29/78642 |
| 2019/0221483 A1* | 7/2019 | Mulfinger | B82Y 10/00 |
| 2019/0341450 A1 | 11/2019 | Lee et al. | |
| 2020/0083219 A1* | 3/2020 | Kang | H01L 29/0653 |
| 2021/0066452 A1* | 3/2021 | Liaw | H01L 29/0665 |
| 2021/0126099 A1* | 4/2021 | Young | H01L 29/785 |
| 2021/0202758 A1* | 7/2021 | Yeong | H01L 29/775 |

* cited by examiner

SEMICONDUCTOR DEVICE WITH CHANNEL PATTERN FORMED OF STACKED SEMICONDUCTOR REGIONS AND GATE ELECTRODE PARTS

CROSS-REFERENCE TO RELATED APPLICATION

This U.S. nonprovisional application claims priority under 35 U.S.C § 119 to Korean Patent Application No. 10-2020-0165549 filed on Dec. 1, 2020 in the Korean Intellectual Property Office, the subject matter of which is hereby incorporated by reference.

BACKGROUND

The inventive concept relates generally to semiconductor devices, and more particularly, to semiconductor devices including a Field Effect Transistor (FET).

Semiconductor devices typically include a number of Metal Oxide Semiconductor FETs (MOSFETs). As the size and associated design rules for semiconductor device gradually decrease, the respective size of MOSFETs also decreases (or scales down). However, the scaling down of MOSFETs may deteriorate operating characteristics of the semiconductor device. Accordingly, various studies have been conducted to develop methods of fabricating semiconductor devices having superior performance while overcoming issues associated with high integration of the semiconductor devices.

SUMMARY

Embodiments of the inventive concept provide semiconductor devices exhibiting improved overall electrical characteristics.

According to some embodiments of the inventive concept, a semiconductor device may include; an active pattern on a substrate, a source/drain pattern on the active pattern, a channel pattern connected to the source/drain pattern and including semiconductor patterns spaced apart in a vertical stack, and a gate electrode extending across the channel pattern, wherein the semiconductor patterns include a first semiconductor pattern and a second semiconductor pattern on the first semiconductor pattern, the gate electrode includes a first part between the substrate and the first semiconductor pattern and a second part between the first semiconductor pattern and the second semiconductor pattern, and a width of the first part varies with a depth of the first part, such that a width of a middle portion of the first part is less than a width of a lower portion of the first part and a width of an upper portion of the first part.

According to some embodiments of the inventive concept, a semiconductor device may include; an active pattern on a substrate, an N-type source/drain pattern on the active pattern including a bottom surface contacting the substrate, a channel pattern connected to the N-type source/drain pattern and including semiconductor patterns spaced apart in a vertical stack, wherein the semiconductor patterns include a first semiconductor pattern and a second semiconductor pattern on the first semiconductor pattern, and a gate electrode extending across the channel pattern and including a first part between the substrate and the first semiconductor pattern. The N-type source/drain pattern includes a protrusion that protrudes in a direction toward the gate electrode, the first part includes a recessed sidewall, and the recessed sidewall faces the protrusion and has a profile that conforms to a profile of the protrusion.

According to some embodiments of the inventive concept, a semiconductor device may include; a substrate including a PMOSFET region and an NMOSFET region adjacent to one another in a first direction, a first active pattern on the PMOSFET region, a first source/drain pattern on the first active pattern, and a first channel pattern connected to the first source/drain pattern and including a first semiconductor pattern, a second semiconductor pattern, and a third semiconductor pattern spaced apart in a first vertical stack, a second active pattern on the NMOSFET region, a second source/drain pattern on the second active pattern, and a second channel pattern on the second source/drain pattern and including the first semiconductor pattern, the second semiconductor pattern, and the third semiconductor pattern spaced apart in a second vertical stack, a first gate electrode extending in the first direction across the first channel pattern and including a first part between the substrate and the first semiconductor pattern, a second part between the first semiconductor pattern and the second semiconductor pattern, a third part between the second semiconductor pattern and the third semiconductor pattern, and a fourth part on the third semiconductor pattern, a second gate electrode extending in the first direction across the second channel pattern and including a first part between the substrate and the first semiconductor pattern, a second part between the first semiconductor pattern and the second semiconductor pattern, a third part between the second semiconductor pattern and the third semiconductor pattern, and a fourth part on the third semiconductor pattern, a first gate dielectric layer between the first channel pattern and the first gate electrode, a second gate dielectric layer between the second channel pattern and the second gate electrode, a first gate spacer on a sidewall of the first gate electrode, a second gate spacer on a sidewall of the second gate electrode, a first gate capping pattern on a top surface of the first gate electrode, a second gate capping pattern on a top surface of the second gate electrode, a first interlayer dielectric layer on the first gate capping pattern and the second gate capping pattern, active contacts penetrating the first interlayer dielectric layer and correspondingly coupled to the first source/drain pattern and the second source/drain pattern, gate contacts penetrating the first interlayer dielectric layer and correspondingly coupled to the first gate electrode and the second gate electrode, a second interlayer dielectric layer on the first interlayer dielectric layer, a first metal layer in the second interlayer dielectric layer and including first lines correspondingly connected to the active contacts and the gate contacts, a third interlayer dielectric layer on the second interlayer dielectric layer, and a second metal layer in the third interlayer dielectric layer and including second lines correspondingly connected to the first lines, wherein a width of the first part of the second gate electrode varies with a depth of the first part of the second gate electrode decreasing to a minimum value and then increasing again in a direction perpendicular to a top surface of the substrate.

BRIEF DESCRIPTION OF THE DRAWINGS

FIGS. 4A to 10D, collectively, are respective cross-sectional views illustrating in one example a method of fabricating a semiconductor device according to embodiments of the inventive concept, wherein FIGS. 4A, 5A, 6A, 7A, 8A, 9A, and 10A are cross-sectional views taken along line A-A' of FIG. 1, FIGS. 6B, 7B, 8B, 9B, and 10B are cross-sectional views taken along line B-B' of FIG. 1, FIGS. 6C, 7C, 8C, 9C, and 10C are cross-sectional views taken along line C-C' of FIG. 1, and FIGS. 4B, 5B, 6D, 7D, 8D, 9D, and 10D are cross-sectional views taken along line D-D' of FIG. 1.

DETAILED DESCRIPTION

Throughout the written description and drawings, like reference numbers and labels are used to denote like or similar elements and/or features. Throughout the written description certain geometric terms may be used to highlight relative relationships between elements, components and/or features with respect to certain embodiments of the inventive concept. Those skilled in the art will recognize that such geometric terms are relative in nature, arbitrary in descriptive relationship(s) and/or directed to aspect(s) of the illustrated embodiments. Geometric terms may include, for example: height/width; vertical/horizontal; top/bottom; higher/lower; closer/farther; thicker/thinner; proximate/distant; above/below; under/over; upper/lower; center/side; surrounding; overlay/underlay; etc.

Figure 1:
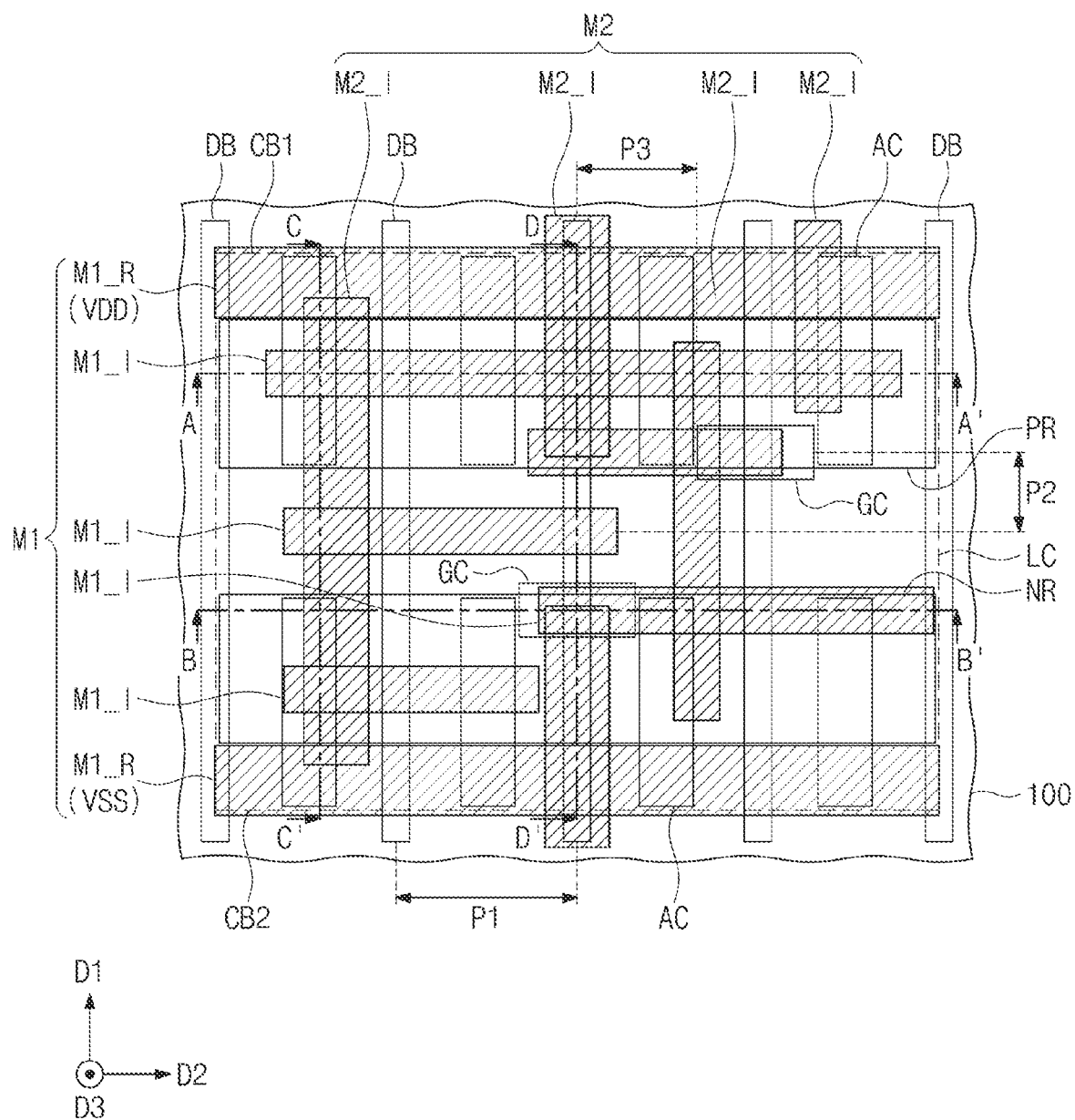
FIG. 1 is a plan (or top-down) view illustrating a semiconductor device according to embodiment of the present inventive concept.

Figure (FIG. 1 is a plan view illustrating a semiconductor device according to embodiments of the inventive concept; FIGS. 2A, 2B, 2C, and 2D (hereafter collectively, "FIGS. 2A to 2D") are respective cross-sectional views taken along lines A-A', B-B', C-C', and D-D' of FIG. 1; and FIG. 3 is an enlarged cross-sectional further illustrating area 'M' of FIG. 2B.

Referring to FIGS. 1 and 2A to 2D, a logic cell LC may be provided on a substrate 100. The logic cell LC may be provided with logic transistors included in a logic circuit. The substrate 100 may be a compound semiconductor substrate or a semiconductor substrate including at least one of silicon, germanium, and silicon-germanium. In some embodiments, the substrate 100 is a silicon substrate.

The logic cell LC may include a P-type MOSFET (PMOSFET) region PR and an N-type MOSFET (NMOSFET) region NR. The PMOSFET region PR and the NMOSFET region NR may be defined by a second trench TR2 formed on an upper portion of the substrate 100. For example, the second trench TR2 may be disposed between the PMOSFET region PR and the NMOSFET region NR. The PMOSFET region PR and the NMOSFET region NR may be spaced apart in a first direction D1 across the second trench TR2.

In this regard and as variously indicated in the accompanying drawings, the first direction D1 may be a first horizontal direction, a second direction D2, substantially orthogonal to the first horizontal direction D1, may be a second horizontal direction, and a third direction D3 may be a vertical direction extending upward from the substrate 100.

A first trench TR1 formed on the upper portion of the substrate 100 may define a first active pattern AP1 and a second active pattern AP2. The first active pattern AP1 and the second active pattern AP2 may be respectively provided on the PMOSFET region PR and the NMOSFET region NR. The first trench TR1 may be shallower than the second trench TR2. Here, the first and second active patterns AP1 and AP2 may extend in the second direction D2, and the first and second active patterns AP1 and AP2 may be respective, vertically protruding portions of the substrate 100.

A device isolation layer ST may substantially fill the first and second trenches TR1 and TR2. In some embodiments, the device isolation layer ST may include a silicon oxide layer. The first and second active patterns AP1 and AP2 may have upper portions that protrude upwards from the device isolation layer ST. (See, e.g., FIG. 2D). The device isolation layer ST may not cover at least upper portions of the first and second active patterns AP1 and AP2. However, the device isolation layer ST may cover lower sidewalls of the first and second active patterns AP1 and AP2.

An upper portion of the first active pattern AP1 may include a first channel pattern CH1, and an upper portion of the second active pattern AP2 may include a second channel pattern CH2. Each of the first and second channel patterns CH1 and CH2 may include a sequentially stacked combination of a first semiconductor pattern SP1, a second semiconductor pattern SP2, and a third semiconductor pattern SP3. The first, second, and third semiconductor patterns SP1, SP2, and SP3 may be spaced apart in the third direction D3.

Each of the first, second, and third semiconductor patterns SP1, SP2, and SP3 may include at least one of silicon (Si), germanium (Ge), and silicon-germanium (SiGe). In some embodiments, each of the first, second, and third semiconductor patterns SP1, SP2, and SP3 may include crystalline silicon.

First recessions RS1 may be formed in upper portions of the first active pattern AP1. Thereafter, first source/drain patterns SD1 may be correspondingly provided in the first recessions RS1. The first source/drain patterns SD1 may be impurity regions including at least one first conductivity type (e.g., P-type) impurity. (Hereafter, source/drain patterns (or regions) having an P-type conductivity may be referred to as "P-type source/drain patterns"). The first channel pattern CH1 may be interposed between a pair of first source/drain patterns SD1. For example, a pair of first source/drain patterns SD1 may be connected through a stacked combination of the first, second, and third semiconductor patterns SP1, SP2, and SP3.

Second recessions RS2 may be formed in upper portions of the second active pattern AP2. Thereafter, second source/drain patterns SD2 may be correspondingly provided in the second recessions RS2. The second source/drain patterns SD2 may be impurity regions including at least one second conductivity type (e.g., N-type) impurity. (Hereafter, source/ drain patterns (or regions) having an N-type conductivity may be referred to as "N-type source/drain patterns") The second channel pattern CH2 may be interposed between a pair of second source/drain patterns SD2. For example, a pair of second source/drain patterns SD2 may be connected through a stacked combination of the first, second, and third semiconductor patterns SP1, SP2 and SP3.

The first and second source/drain patterns SD1 and SD2 may be epitaxial patterns formed using a selective epitaxial growth (SEG) process. For example, each of the first and second source/drain patterns SD1 and SD2 may have a top surface disposed at a level substantially the same as a top surface of the third semiconductor pattern SP3. Alternately, each of the first and second source/drain patterns SD1 and SD2 may have a top surface disposed at a level higher than a top surface of the third semiconductor pattern SP3.

The first source/drain patterns SD1 may include a semiconductor element (e.g., SiGe) having a lattice constant greater than that of a semiconductor element of the substrate 100. The first source/drain patterns SD1 may therefore provide the first channel pattern CH1 having compressive stress. The second source/drain patterns SD2 may include at least one semiconductor element (e.g., Si) the same as the substrate 100.

Gate electrodes GE may be provided that extend in the first direction D1—or that run across the first and second active patterns AP1 and AP2. The gate electrodes GE may be arranged with a first pitch P1 in the second direction D2. Here, each of the gate electrodes GE may vertically overlap the first and second channel patterns CH1 and CH2.

In the illustrated embodiment of FIGS. 1 and 2A to 2D, the gate electrode GE may include a first part PO1 interposed between the substrate 100 and the first semiconductor pattern SP1, a second part PO2 interposed between the first semiconductor pattern SP1 and the second semiconductor pattern SP2, a third part PO3 interposed between the second semiconductor pattern SP2 and the third semiconductor pattern SP3, and a fourth part PO4 on the third semiconductor pattern SP3.

Figure 2A:
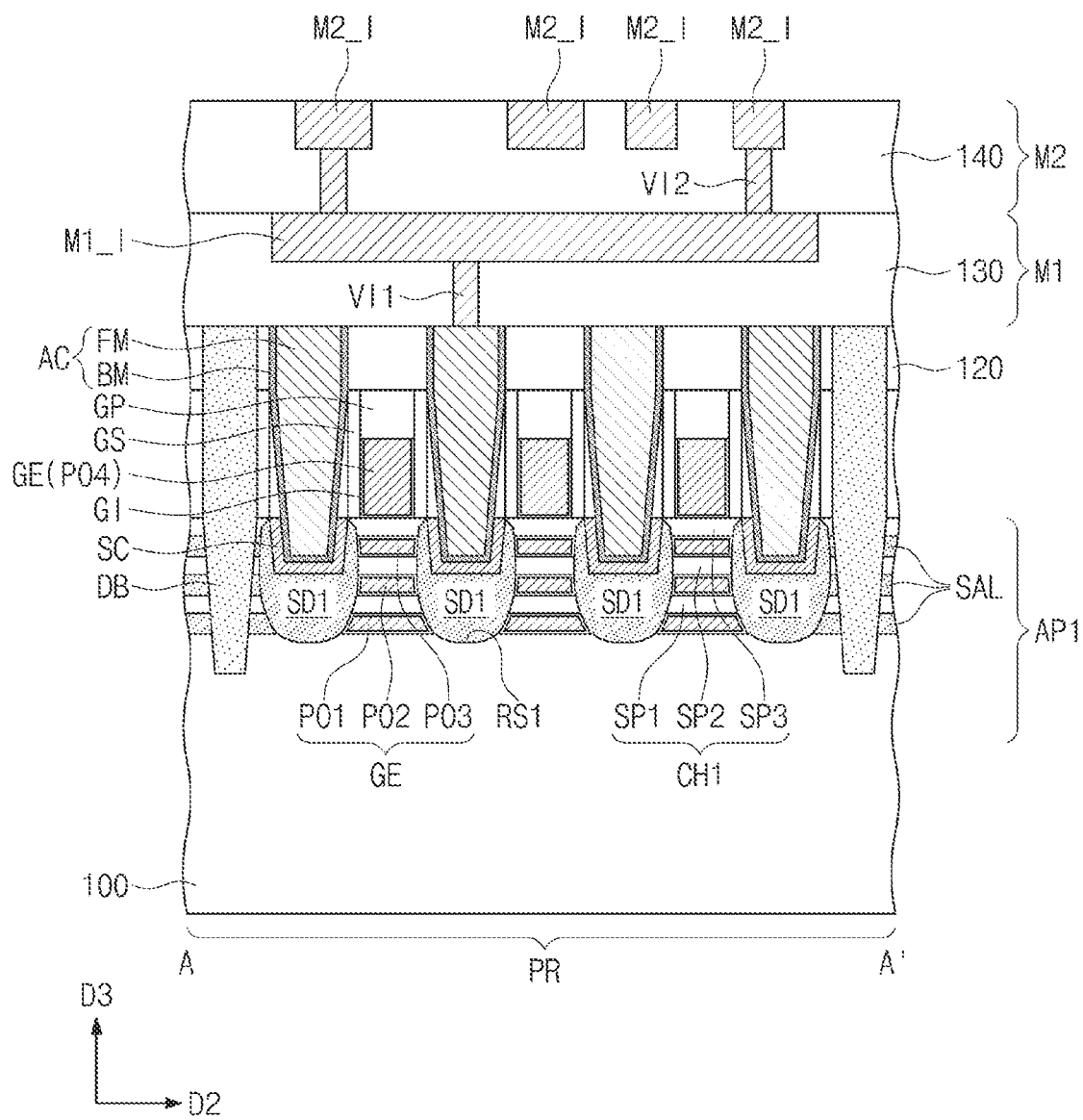
FIGS. 2A, 2B, 2C, and 2D are respective cross-sectional views taken along lines A-A', B-B', C-C', and D-D' of FIG. 1.
Figure 3:
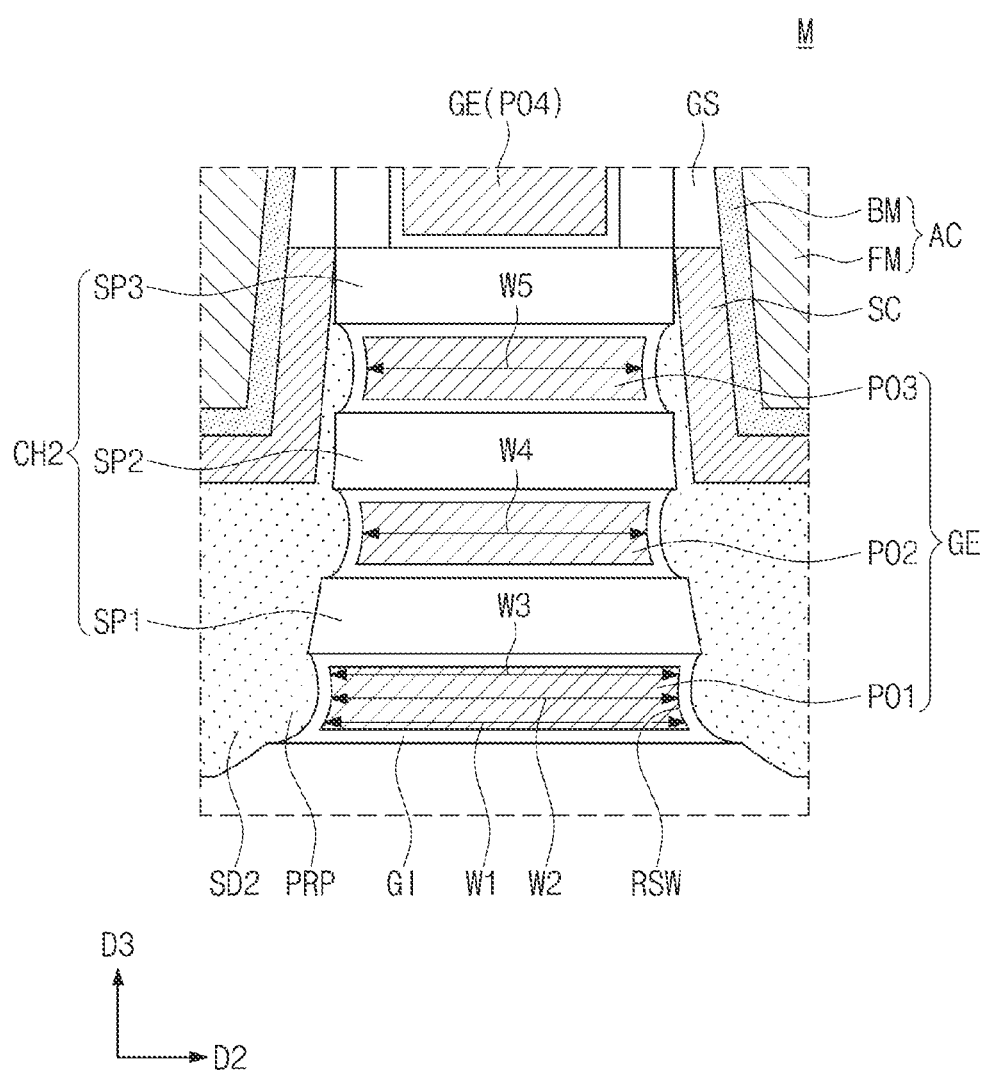
FIG. 3 is an enlarged cross-sectional view further illustrating area 'M' indicated in FIG. 2B.

Referring the PMOSFET region PR of FIG. 2A, the first, second, and third parts PO1, PO2, and PO3 of the gate electrode GE may have different respective widths (as measured in the second direction D2). For example, a maximum width of the third part PO3 may be greater than a maximum width of the second part PO2. A maximum width of the first part PO1 may be greater than the maximum width of the third part PO3.

Figure 2B:
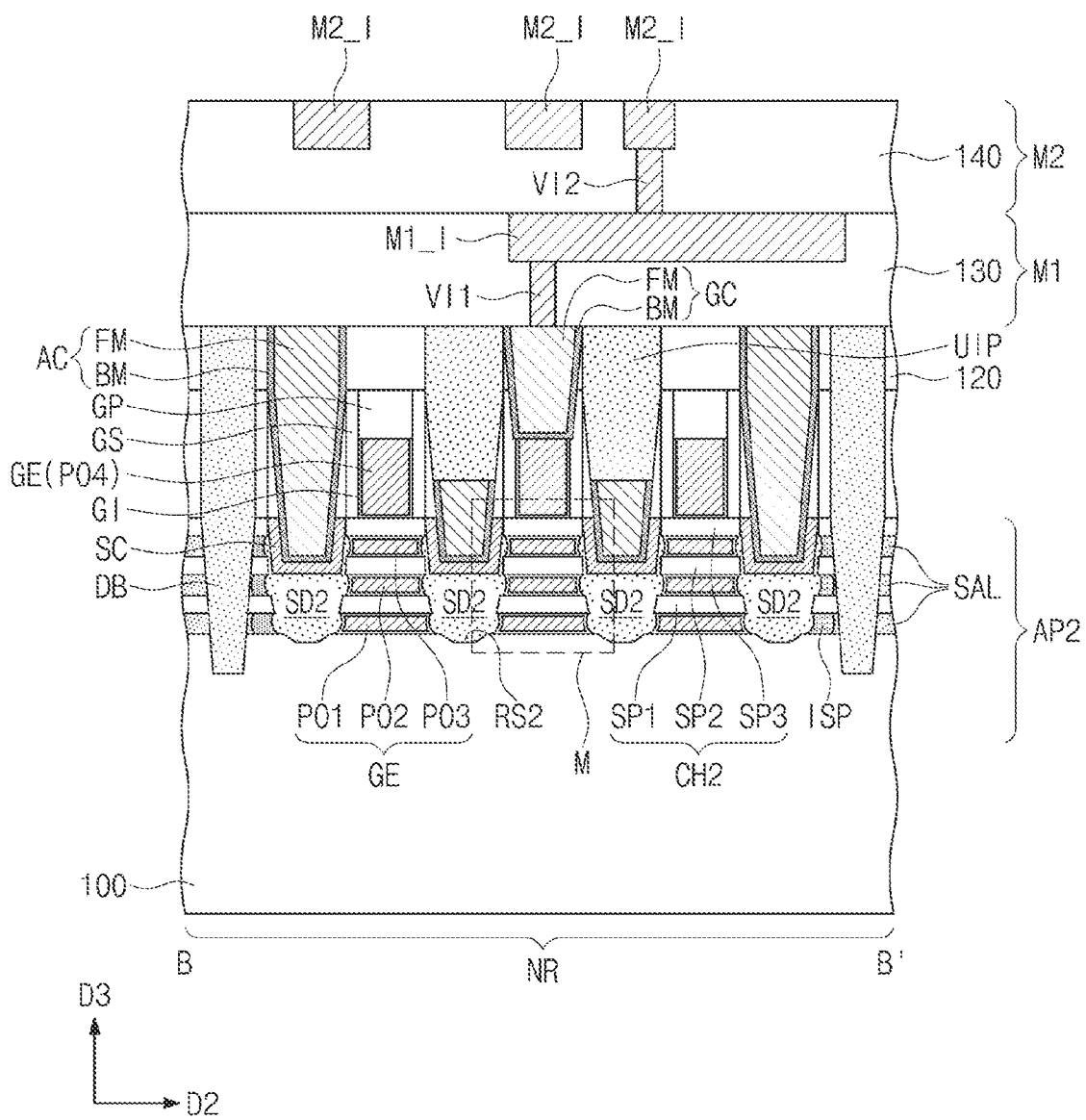
Figure 2C:
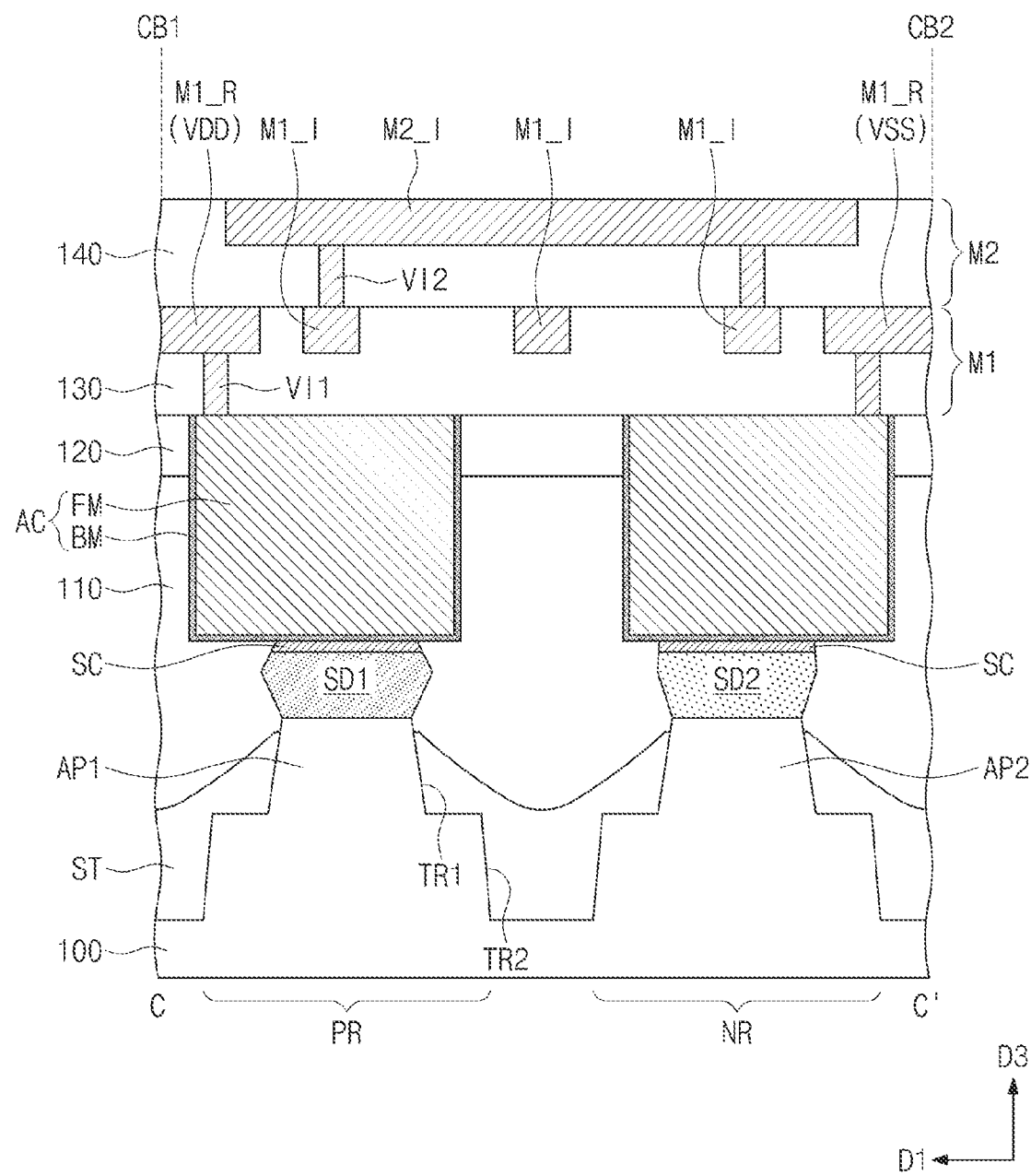
Figure 2D:
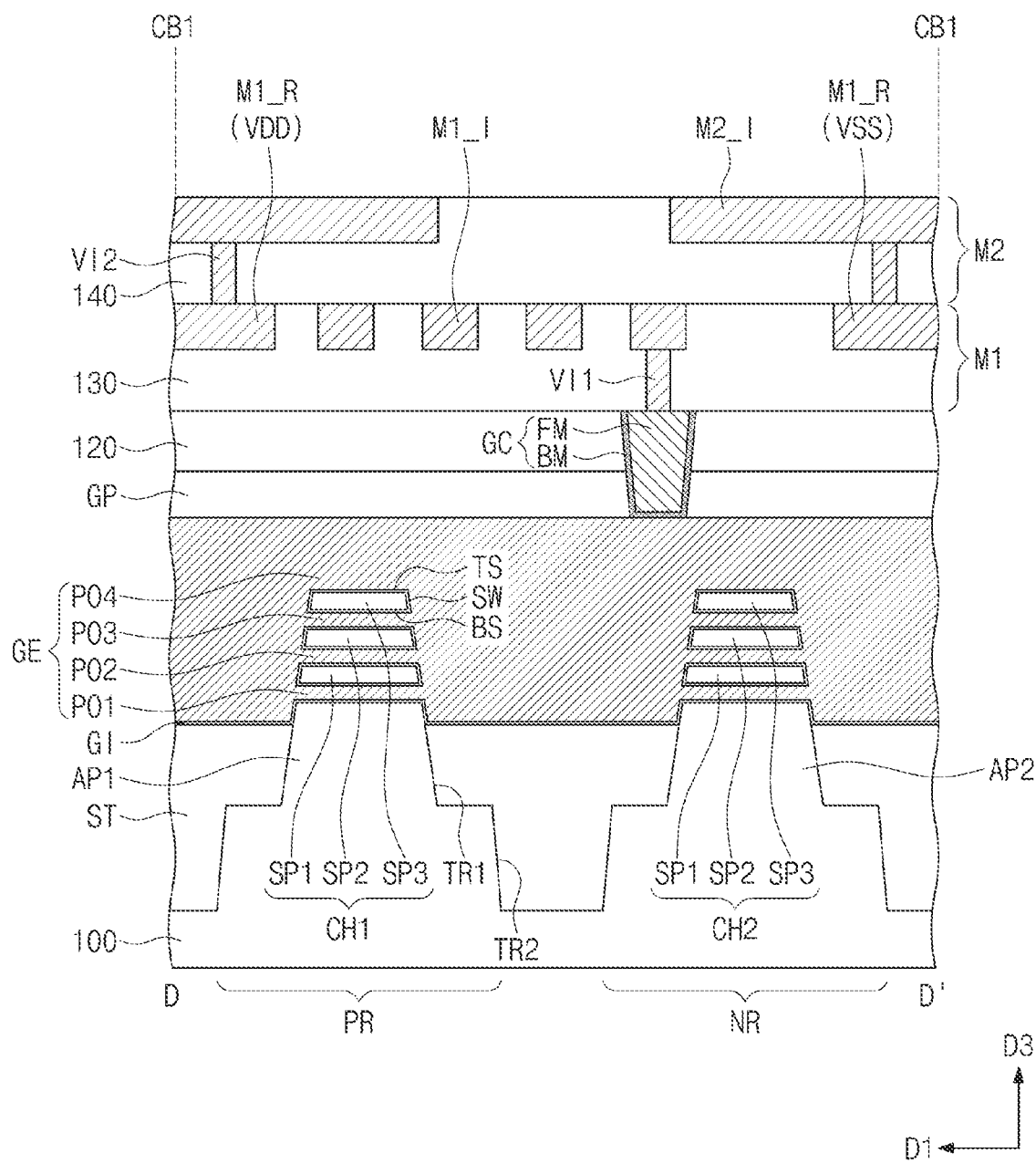

Referring to FIG. 2D, the gate electrode GE may be provided on a top surface TS, a bottom surface BS, and opposite sidewalls SW of each of the first, second, and third semiconductor patterns SP1, SP2, and SP3. With this configuration, a transistor according to some embodiments may be a three-dimensional (3D) FET (e.g., a multi-bridge channel (MBC) FET or MBCFET) in which the gate electrode GE three-dimensionally surrounds the first and second channel patterns CH1 and CH2.

Referring to FIGS. 1 and 2A to 2D, a pair of gate spacers GS may be disposed on opposite sidewalls of the fourth part PO4 of the gate electrode GE. The gate spacers GS may extend in the first direction D1 along the gate electrode GE. The gate spacers GS may have top surfaces at a higher level than the gate electrode GE. The top surfaces of the gate spacers GS may be coplanar with a first interlayer dielectric layer 110 described hereafter. The gate spacers GS may include a layer including at least one of SiCN, SiCON, and SiN. Alternatively, the gate spacers GS may include a multi-layer including at least two of SiCN, SiCON, and SiN.

A gate capping pattern GP may be disposed on the gate electrode GE. The gate capping pattern GP may extend in the first direction D1 along the gate electrode GE. The gate capping pattern GP may include a material having an etch selectivity with respect to first and second interlayer dielectric layers 110 and 120, as described hereafter. For example, the gate capping pattern GP may include at least one of SiON, SiCN, SiCON, and SiN.

A gate dielectric layer GI may be interposed between the gate electrode GE and the first channel pattern CH1 and between the gate electrode GE and the second channel pattern CH2. The gate dielectric layer GI may cover the top surface TS, the bottom surface BS, and the opposite sidewalls SW of each of the first, second, and third semiconductor patterns SP1, SP2, and SP3. The gate dielectric layer GI may cover a top surface of the device isolation layer ST underlying the gate electrode GE. (See, e.g., FIG. 2D).

In some embodiments, the gate dielectric layer GI may include at least one of a silicon oxide layer, a silicon oxynitride layer, and a high-k dielectric layer. The high-k dielectric layer may include at least one material having a dielectric constant greater than silicon oxide. For example, the high-k dielectric material may include at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

In some embodiments, a semiconductor device may include a negative capacitance field effect transistor that uses a negative capacitor. For example, the gate dielectric layer GI may include a ferroelectric material layer having ferroelectric properties and a paraelectric material layer having paraelectric properties.

The ferroelectric material layer may have a negative capacitance, whereas the paraelectric material layer may have a positive capacitance. For example, when two or more capacitors are connected in series, and when each capacitor has a positive capacitance, an overall capacitance may be reduced to be less than the capacitance of each capacitor. Alternately, when at least one of two or more capacitors connected in series has a negative capacitance, an overall capacitance may have a positive value that is increased to be greater than an absolute value of the capacitance of each capacitor.

When the ferroelectric material layer having a negative capacitance is connected in series to the paraelectric material layer having a positive capacitance, there may be an increase in the overall capacitance of the series-connected ferroelectric and paraelectric material layers. The increase in overall capacitance may be used to allow a transistor including the ferroelectric material layer to have a sub-threshold swing of less than about 60 mV/decade at room temperature.

The ferroelectric material layer may include, for example, at least one of hafnium oxide, hafnium zirconium oxide, barium strontium titanium oxide, and lead zirconium titanium oxide. For example, the hafnium zirconium oxide may be a material in which hafnium oxide is doped with zirconium (Zr). For another example, the hafnium zirconium oxide may be a compound of hafnium (Hf), zirconium (Zr), and oxygen (O).

The ferroelectric material layer may be doped with one or more impurities, such as (e.g.,) aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and tin (Sn). The particular impurity type(s) included in the ferroelectric material layer may vary with the type ferroelectric material included in the ferroelectric material layer. However, in some embodiments, assuming the ferroelectric material layer includes hafnium oxide, the ferroelectric material layer may include at least one of gadolinium (Gd), silicon (Si), zirconium (Zr), aluminum (Al), and yttrium (Y).

When the impurities are aluminum (Al), the ferroelectric material layer may include about 3 to 8 atomic percent aluminum (e.g., a ratio of aluminum to the sum of hafnium and aluminum). When the impurities are silicon (Si), the ferroelectric material layer may include about 2 to 10 atomic percent silicon. When the impurities are yttrium (Y), the ferroelectric material layer may include about 2 to 10 atomic percent yttrium. When the impurities are gadolinium (Gd), the ferroelectric material layer may include about 1 to 7 atomic percent gadolinium. When the impurities are zirconium (Zr), the ferroelectric material layer may include about 50 to 80 atomic percent zirconium.

The paraelectric material layer may include, for example, at least one of silicon oxide and a high-k metal oxide. The high-k metal oxide included in the paraelectric material layer may include, for example, at least one of hafnium oxide, zirconium oxide, and aluminum oxide, but embodiments of the inventive concept are not limited thereto.

The ferroelectric and paraelectric material layers may include the same material. The ferroelectric material layer may exhibit ferroelectric properties, but the paraelectric material layer may not exhibit ferroelectric properties. For example, when the ferroelectric material layer and the paraelectric material layer include hafnium oxide, the hafnium oxide included in the ferroelectric material layer may have a different crystal structure from that of the hafnium oxide included in the paraelectric material layer.

The ferroelectric material layer may have a particular ferroelectric thickness exhibiting ferroelectric properties. In some embodiments, the ferroelectric thickness may range, for example, from about 0.5 nm to about 10 nm, but embodiments of the inventive concept are not limited thereto. Because ferroelectric materials have their own critical thickness exhibiting ferroelectric properties, the thickness of the ferroelectric material layer may depend on the type of ferroelectric material.

In some embodiments, the gate dielectric layer GI may include a single ferroelectric material layer. Alternately, the gate dielectric layer GI may include multiple, spaced apart ferroelectric material layers. That is, the gate dielectric layer GI may have a stack structure including ferroelectric material layers alternately stacked with paraelectric material layers.

The gate electrode GE may include a first metal pattern and a second metal pattern on the first metal pattern. The first metal pattern may be provided on the gate dielectric layer GI and may be adjacent to the first, second, and third semiconductor patterns SP1, SP2, and SP3. The first metal pattern may include a work function metal that controls a threshold voltage of a transistor. A thickness and composition of the first metal pattern may be adjusted to achieve a desired transistor threshold voltage. For example, the first, second, and third parts PO1, PO2, and PO3 of the gate electrode GE may include the first metal pattern (or a first work function metal).

In some embodiments, the first metal pattern may include a metal nitride layer. For example, the first metal pattern may include nitrogen (N) and at least one metal, such as titanium (Ti), tantalum (Ta), aluminum (Al), tungsten (W), and molybdenum (Mo). In addition, the first metal pattern may further include carbon (C). The first metal pattern may include stacked first work function metal layers.

The second metal pattern may include metal having an electrical resistance less than the electrical resistance of the first metal pattern. For example, the second metal pattern may include at least one metal such as tungsten (W), aluminum (Al), titanium (Ti), and tantalum (Ta). The fourth part PO4 of the gate electrode GE may include, for example, the first metal pattern and the second metal pattern disposed on the first metal pattern.

A first interlayer dielectric layer 110 may be provided on the substrate 100. The first interlayer dielectric layer 110 may cover the gate spacers GS and the first and second source/drain patterns SD1 and SD2. The first interlayer dielectric layer 110 may have a top surface substantially coplanar with a top surface of the gate capping pattern GP and a top surface of the gate spacer GS. The first interlayer dielectric layer 110 may be provided thereon with a second interlayer dielectric layer 120 that covers the gate capping pattern GP. In some embodiments, the first and second interlayer dielectric layers 110 and 120 may include a silicon oxide layer.

Opposing sides of the logic cell LC may be defined by a pair of separation structures DB facing each other in the second direction D2. The separation structures DB may extend in the first direction D1 parallel to the gate electrodes GE. A pitch between the separation structure DB and its adjacent gate electrode GE may be the same as the first pitch P1.

The separation structure DB may penetrate the first and second interlayer dielectric layers 110 and 120 and may extend into the first and second active patterns AP1 and AP2. The separation structure DB may penetrate the upper portion of each of the first and second active patterns AP1 and AP2. The separation structure DB may separate the PMOSFET and NMOSFET regions PR and NR of the logic cell LC from other PMOSFET and NMOSFET regions of an adjacent logic cell.

Each of the first and second active patterns AP1 and AP2 may include, on its upper portion, sacrificial layers SAL adjacent to the separation structure DB. The sacrificial layers SAL may be stacked and spaced apart. The sacrificial layers SAL may each be disposed at the same level as that of a corresponding one of the first, second, and third parts PO1, PO2, and PO3. The separation structure DB may penetrate the sacrificial layers SAL. Inner spacers ISP may be interposed between the sacrificial layers SAL and the second source/drain pattern SD2. In some embodiments, the inner spacers ISP may include silicon nitride.

Active contacts AC may be provided to penetrate the first and second interlayer dielectric layers 110 and 120 and to have electrical connection with the first and second source/drain patterns SD1 and SD2. A pair of active contacts AC may be provided on opposite sides of the gate electrode GE. The active contact AC may have a bar shape extending in the first direction D1. The active contact AC may be a self-aligned contact. For example, the gate capping pattern GP and the gate spacer GS may be used to form the active contact AC in a self-aligned manner. For example, the active contact AC may cover at least a portion of a sidewall of the gate spacer GS. The active contact AC may cover a portion of the top surface of the gate capping pattern GP.

A silicide pattern SC may be interposed between the active contact AC and the first source/drain pattern SD1 and between the active contact AC and the second source/drain pattern SD2. The active contact AC may be electrically connected through the silicide pattern SC to one of the first and second source/drain patterns SD1 and SD2. The silicide pattern SC may include at least one metal silicide, such as titanium silicide, tantalum silicide, tungsten silicide, nickel silicide, and cobalt silicide.

A gate contact GC may penetrate the second interlayer dielectric layer 120 and the gate capping pattern GP to provide electrical connection with the gate electrode GE. For example, referring to FIG. 2B, an upper dielectric pattern UIP may fill an upper portion of each of the active contacts AC, which upper portion is adjacent to the gate contact GC. Therefore, it may be possible to prevent process failures such as an electrical shorts caused by unintended contact between the gate contact GC and the adjacent active contact AC.

Each of the active contact AC and the gate contact GC may include a conductive pattern FM and a barrier pattern BM surrounding the conductive pattern FM. For example, the conductive pattern FM may include at least one metal, such as aluminum, copper, tungsten, molybdenum, and cobalt. The barrier pattern BM may cover sidewalls and a bottom surface of the conductive pattern FM. The barrier pattern BM may include a metal layer and a metal nitride layer. Here, the metal layer may include at least one of titanium, tantalum, tungsten, nickel, cobalt, and platinum. The metal nitride layer may include at least one of titanium nitride (TiN) layer, a tantalum nitride (TaN) layer, a tungsten nitride (WN) layer, a nickel nitride (NiN) layer, a cobalt nitride (CoN) layer, and a platinum nitride (PtN) layer.

A first metal layer M1 may be provided in a third interlayer dielectric layer 130. The first metal layer M1 may include first lower lines M1_R, second lower lines M1_I, and lower vias VI1. The lower vias VI1 may be provided below the first and second lower lines M1_R and M1_I.

Each of the first lower lines M1_R may extend in the second direction D2, to run across the logic cell LC. Each of the first lower lines M1_R may be a power line. For example, the first lower line M1_R may be supplied with a drain voltage VDD or a source voltage VSS.

Referring to FIG. 1, the logic cell LC may include a first cell boundary CB1 that extends in the second direction D2. On the logic cell LC, a second cell boundary CB2 may be defined at a location opposite to that on which the first cell boundary CB1 is defined. The first cell boundary CB1 may be provided thereon with the first lower line M1_R to which is applied the drain voltage VDD or power voltage. The first lower line M1_R to which the drain voltage VDD is applied may extend in the second direction D2 along the first cell boundary CB1. The second cell boundary CB2 may be provided thereon with the first lower line M1_R to which is applied the source voltage VSS or ground voltage. The first lower line M1_R to which the source voltage VSS is applied may extend in the second direction D2 along the second cell boundary CB2.

The second lower lines M1_I may extend in the first direction D1 between the first lower line M1_R to which the drain voltage VDD is applied and the first lower line M1_R to which the source voltage VSS is applied. Each of the second lower lines M1_I may have a linear or bar shape extending in the second direction D2. The second lower lines M1_I may be arranged at a second pitch P2 in the first direction D1, wherein the second pitch P2 is less than the first pitch P1.

The lower vias VI1 may be provided below the first and second lower lines M1_R and M1_I of the first metal layer M1. The lower vias VI1 may be correspondingly interposed between the active contacts AC and the first and second lower lines M1_R and M1_I. The lower vias VI1 may be correspondingly interposed between the gate contacts GC and the second lower lines M1_I.

The lower line M1_R or M1_I and its underling lower via VI1 of the first metal layer M1 may be formed by separate processes from each other. For example, each of the lower line M1_R or M1_I and the lower via VI1 may be formed by a single damascene process. In this regard, a sub-20 nm process may be employed to fabricate a semiconductor device according to embodiments of the inventive concept.

A second metal layer M2 may be provided in a fourth interlayer dielectric layer 140. The second metal layer M2 may include upper lines M2_I. Each of the upper lines M2_I may have a linear or bar shape extending in the first direction D1. For example, the upper lines M2_I may extend in parallel in the first direction D1. The upper lines M2_I may be arranged parallel to the gate electrodes GE. The upper lines M2_I may be arranged at a third pitch P3 in the second direction D2, wherein the third pitch P3 is less than the first pitch P1, and the third pitch P3 is greater than the second pitch P2.

The second metal layer M2 may further include upper vias VI2. The upper vias VI2 may be provided below the upper lines M2_I. The upper vias VI2 may be correspondingly interposed between the upper lines M2_I and the lower lines M1_R and M1_I.

The upper line M2_I of the second metal layer M2 and its underlying upper via VI2 may be formed into a single piece in the same process. For example, a dual damascene process may be employed to simultaneously form the upper via VI2 and the upper line M2_I of the second metal layer M2.

The lower lines M1_R and M1_I of the first metal layer M1 may include a conductive material the same as or different from that of the upper lines M2_I of the second metal layer M2. For example, the upper lines M2_I and the lower lines M1_R and M1_I may include at least one metallic material, such as aluminum, copper, tungsten, molybdenum, and cobalt.

In some embodiments, although explicitly shown in FIGS. 1 and 2A to 2D, stacked metal layers (e.g., M3, M4, M5, etc.) may be additionally provided on the fourth interlayer dielectric layer 140, wherein one or more of the stacked metal layers may serve as a routing line.

Referring to FIG. 3 further illustrating the area 'M' indicated in FIG. 2B, a more detailed description of the gate electrode GE and the second source/drain pattern SD2 on the NMOSFET region NR follows.

The second source/drain pattern SD2 may include protrusions PRP. The protrusions PRP may protrude in a direction from the second source/drain pattern SD2 towards the gate electrode GE. Each of the protrusions PRP may have a non-linear (or crooked) profile. For example, one or more of the protrusions PRP may respectively protrude towards one or more of the first, second, and third parts PO1, PO2, and PO3 of the gate electrode GE.

Each of the first, second, and third parts PO1, PO2, and PO3 of the gate electrode GE may include a recessed sidewall RSW. The recessed sidewall RSW may be recessed in a direction away from the second source/drain pattern SD2. The recessed sidewall RSW may adjoin and face the protrusion PRP. The recessed sidewall RSW may have a profile that conforms to that of the protrusion PRP. The gate dielectric layer GI may be interposed between the protrusion PRP and the recessed sidewall RSW.

The second source/drain pattern SD2 may be in direct contact with the gate dielectric layer GI and the first, second, and third semiconductor patterns SP1, SP2, and SP3. The second source/drain pattern SD2 may have a floor (or bottom portion) in contact with a floor of the second recession RS2 or with the substrate 100.

The first part PO1 of the gate electrode GE may have a "width" that varies in the second direction D2 according to a "depth" of the first part PO1 in the third direction D3. For example, the first part PO1 may have a width that gradually decreases to a minimum width, and then gradually increases in accordance with a location along the depth profile (e.g., a positional location along the depth profile) of the first part PO1. Thus, the first part PO1 may have a first width W1 at a lower portion (in relation to its depth in the third direction D3), a second width W2 at a middle portion, and a third width W3 at an upper portion. Here, the second width W2 may be less than the first width W1 and the third width W3. The third width W3 may be less than the first width W1. That is, the second width W2 may be the minimum width of the first part PO1.

In analogous manner, a minimum width of the second part PO2 may be a fourth width W4, and a minimum width of the third part PO3 may be a fifth width W5. In this regard, the first, second, and third parts PO1, PO2, and PO3 may have different, respective minimum widths. For example, the minimum width W2 of the first part PO1 may be greater than the minimum width W4 of the second part PO2, and the minimum width W4 of the second part PO2 may be greater than the minimum width W5 of the third part PO3. In some embodiments, the first, second, and third parts PO1, PO2, and PO3 may have respective minimum widths that vary according to level (e.g., a position expressed in the third direction D3 with respect to an upper surface of the substrate 100). However, each of the second and third parts PO2 and PO3 of the gate electrode GE may have a width that varies in the second direction D2 according to its respective depth in the third direction D3, as described above in relation to the first part PO1.

When the inner spacer ISP is provided between the gate electrode GE and the second source/drain pattern SD2, a parasitic capacitance may be produced between the gate electrode GE and the second source/drain pattern SD2. Such parasitic capacitance may reduce performance and degrade electrical characteristic of the semiconductor device.

Accordingly in certain embodiments of the inventive concept, the inner spacer ISP may be omitted between the gate electrode GE and the second source/drain pattern SD2, and thus the parasitic capacitance may be reduced between the gate electrode GE and the second source/drain pattern SD2. As a result, semiconductor devices according to embodiments of the inventive concept provide improved overall electrical characteristics.

FIGS. 4A, 4B, 5A, 5B, 6A, 6B, 6C, 6D, 7A, 7B, 7C, 7D, 8A, 8B, 8C, 8D, 9A, 9B, 9C, 9D, 10A, 10B, 10C and 10D (hereafter collectively, "FIGS. 4A to 10D") are respective, cross-sectional views illustrating in one example a method of fabricating a semiconductor device according to embodiments of the inventive concept. Here, FIGS. 4A, 5A, 6A, 7A, 8A, 9A, and 10A are cross-sectional views taken along line A-A' of FIG. 1; FIGS. 6B, 7B, 8B, 9B, and 10B are cross-sectional views taken along line B-B' of FIG. 1; FIGS. 6C, 7C, 8C, 9C, and 10C are cross-sectional views taken along line C-C' of FIG. 1; and FIGS. 4B, 5B, 6D, 7D, 8D, 9D, and 10D are cross-sectional views taken along line D-D' of FIG. 1.

Figure 6A:
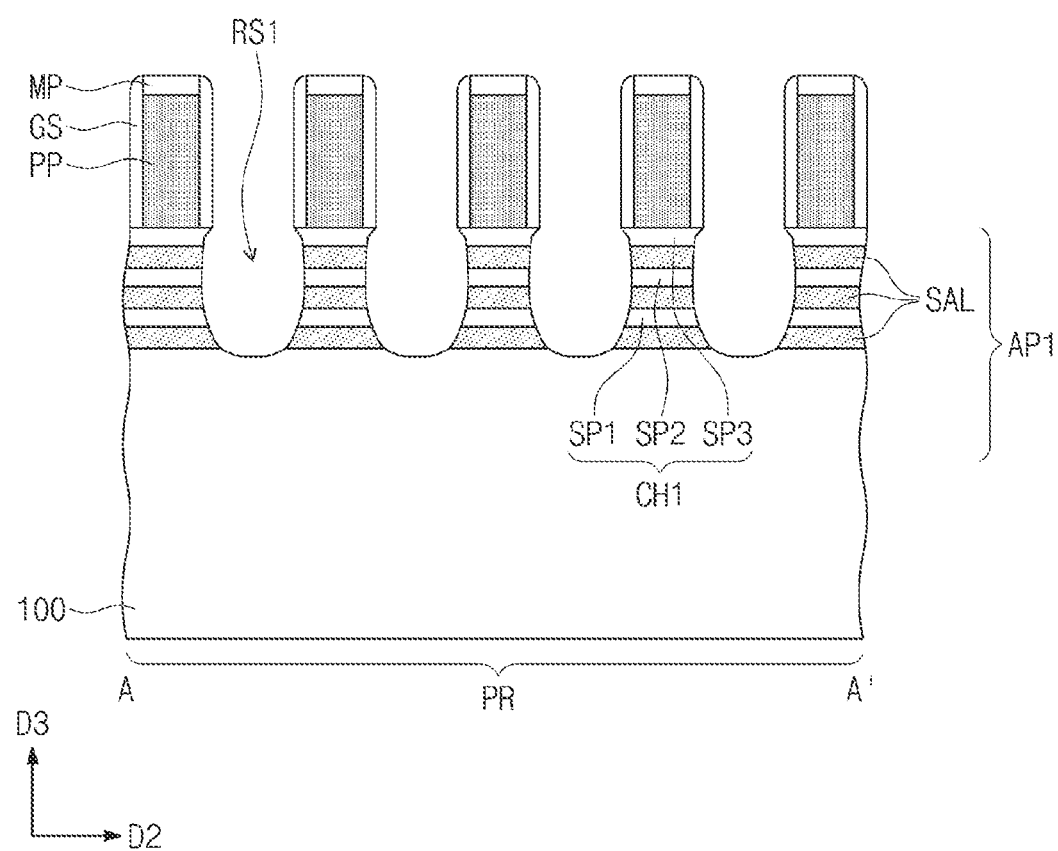
Figure 6B:
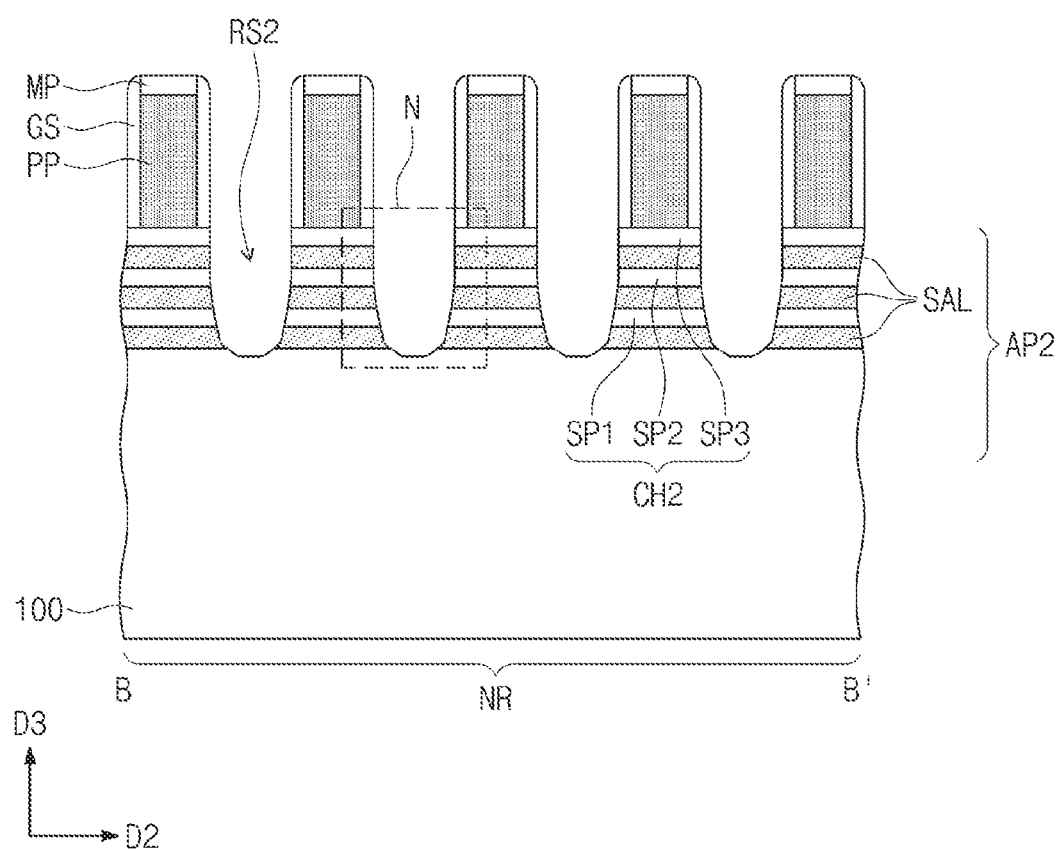
Figure 6C:
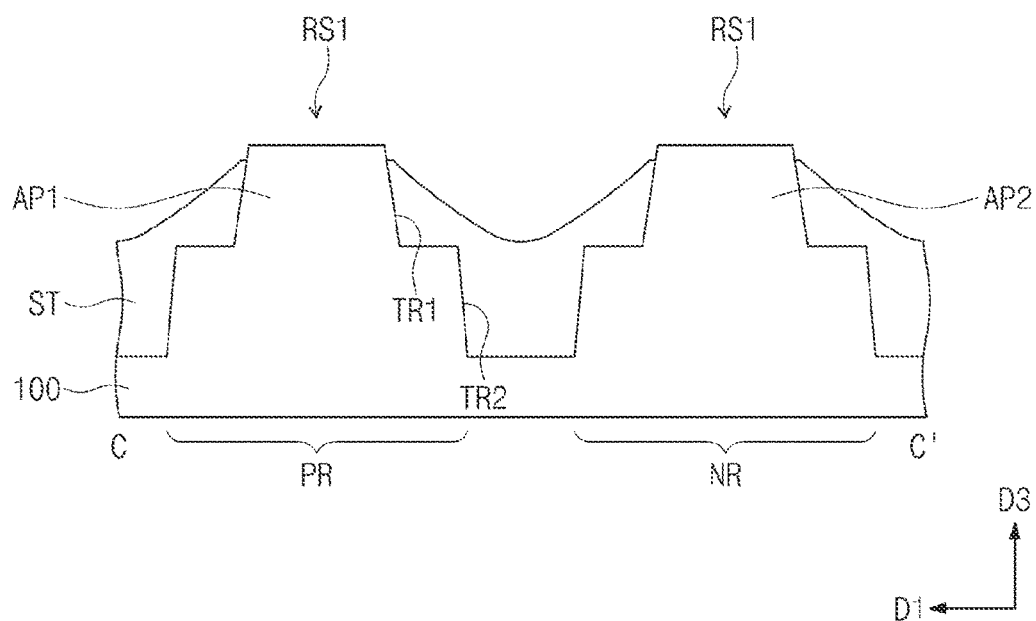
Figure 6D:
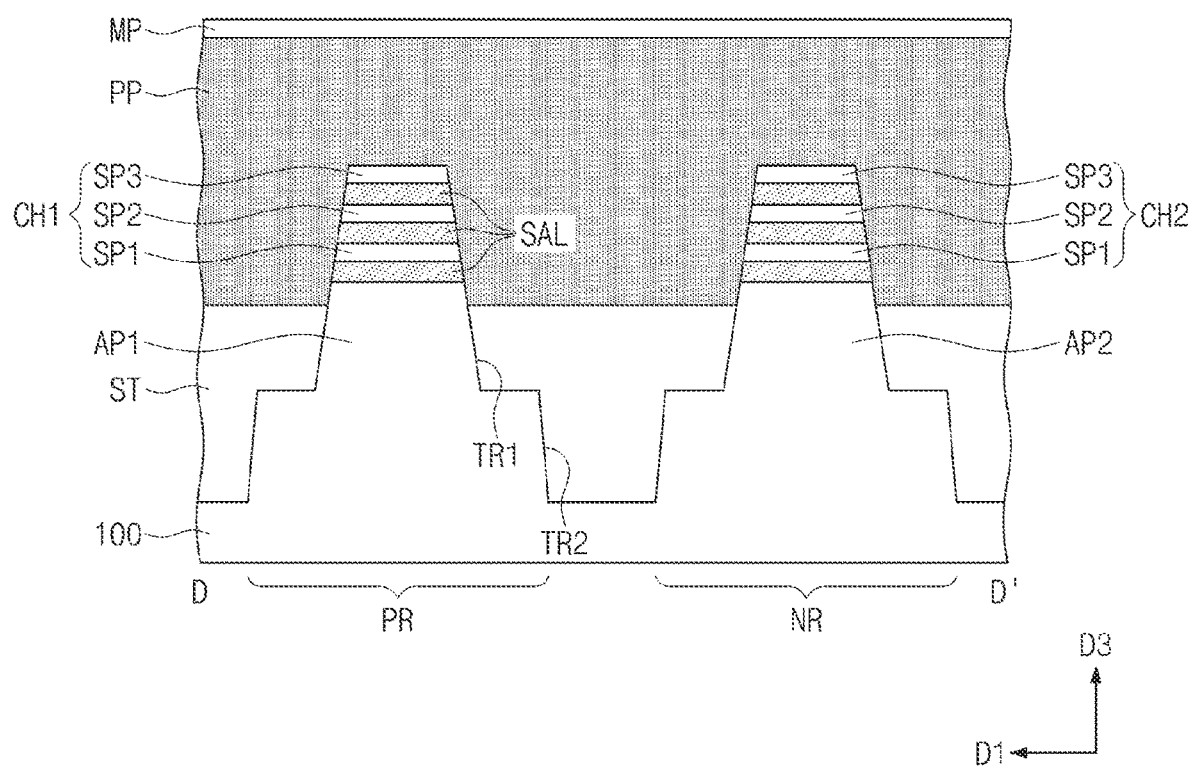
Figure 7A:
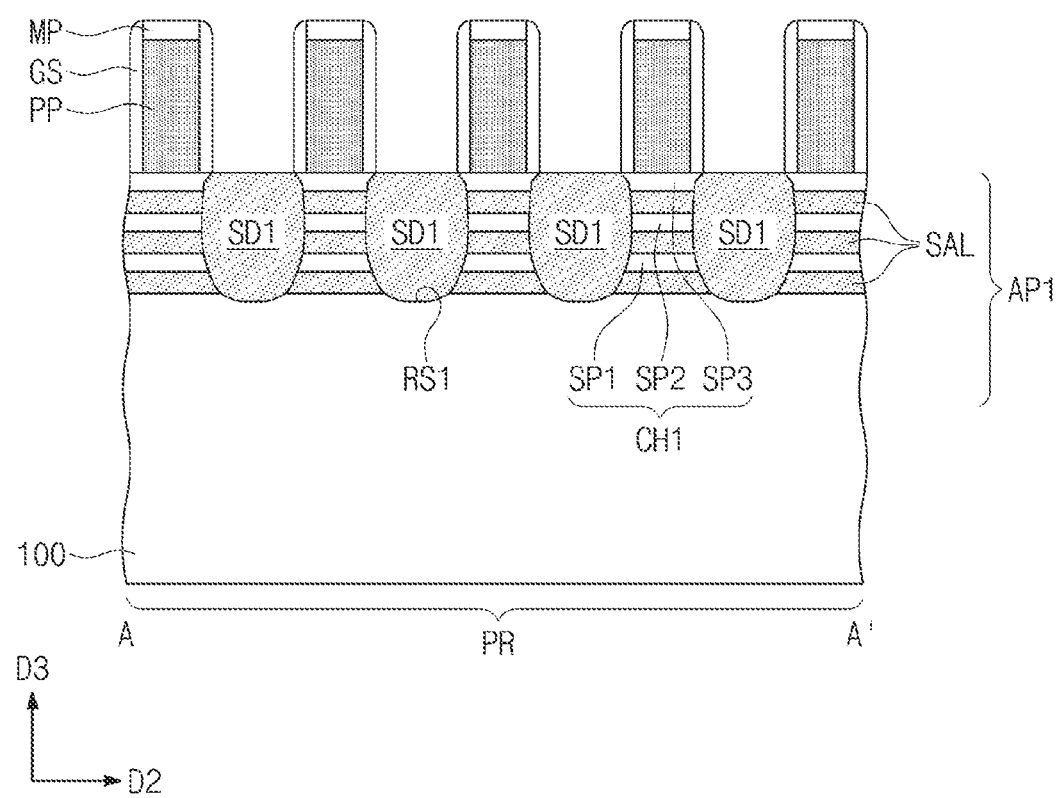
Figure 7B:
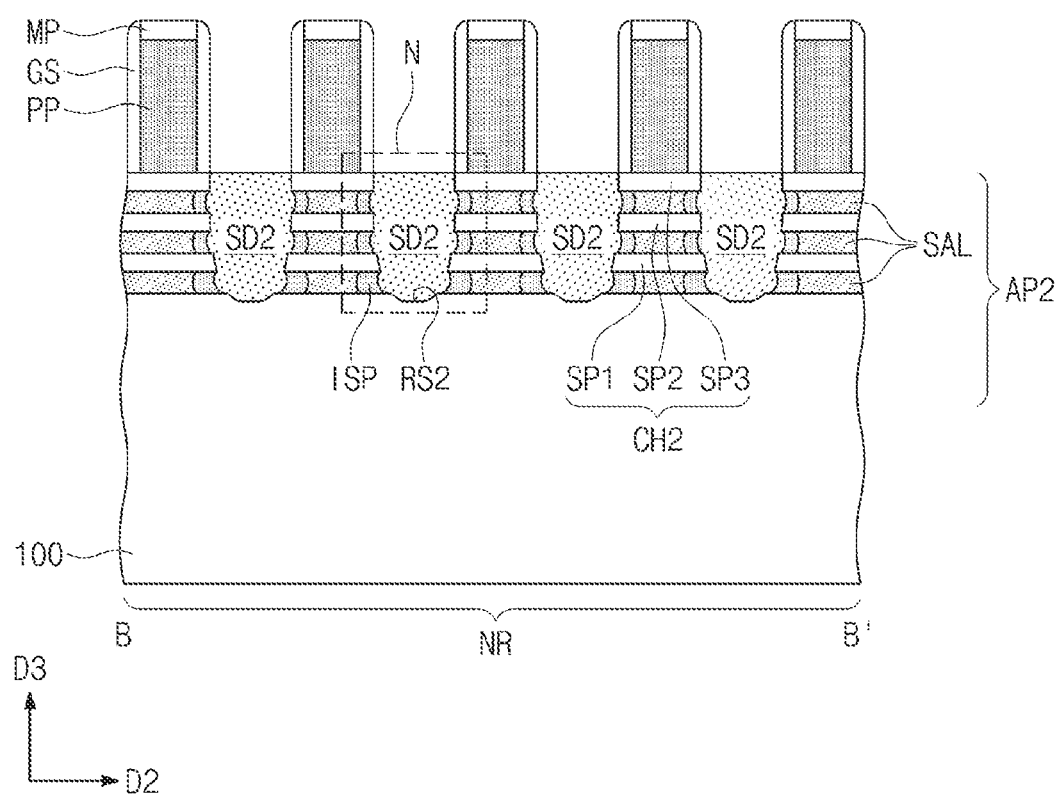
Figure 7C:
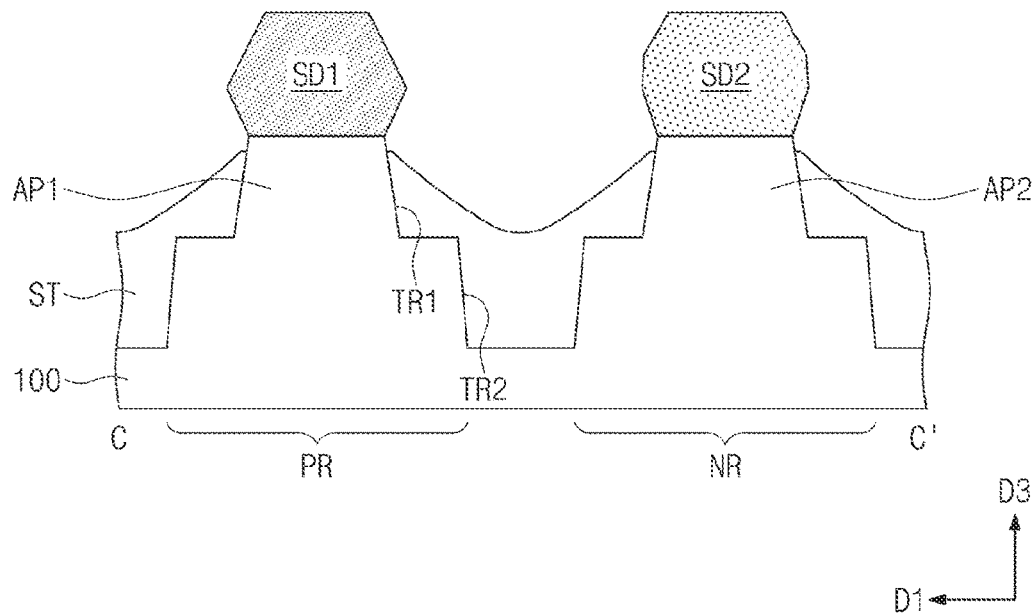
Figure 7D:
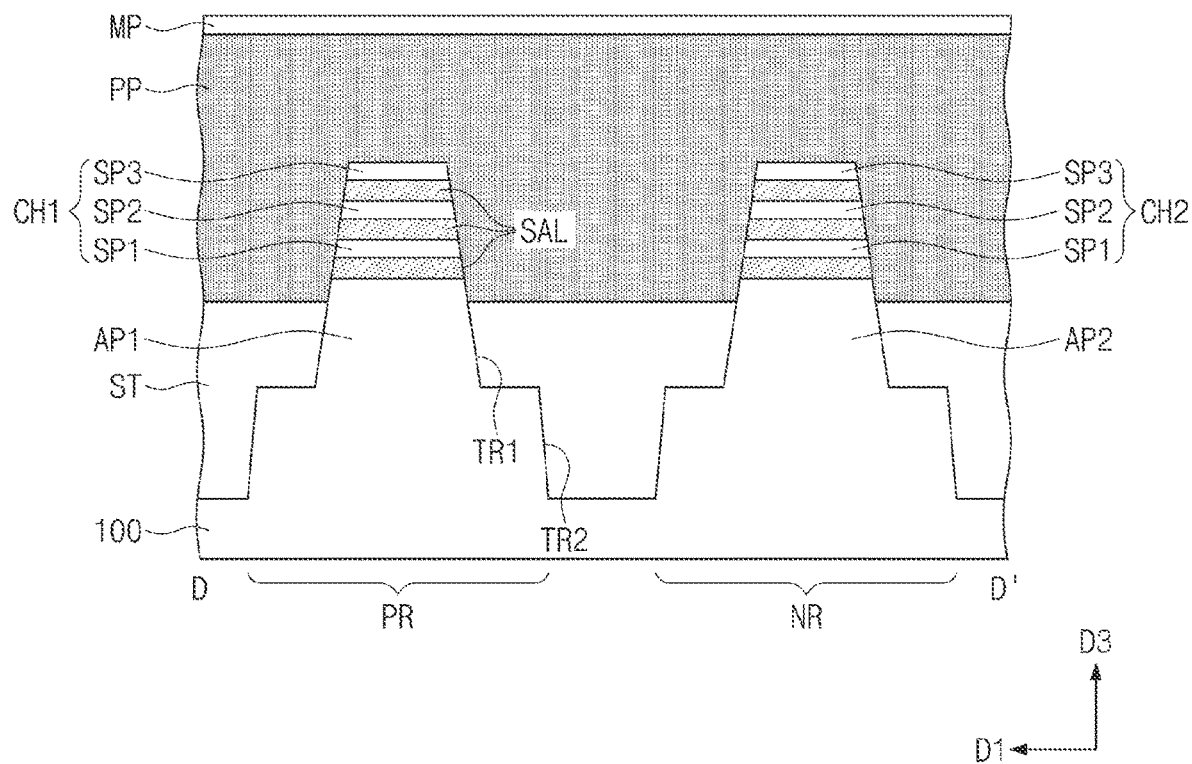
Figure 8A:
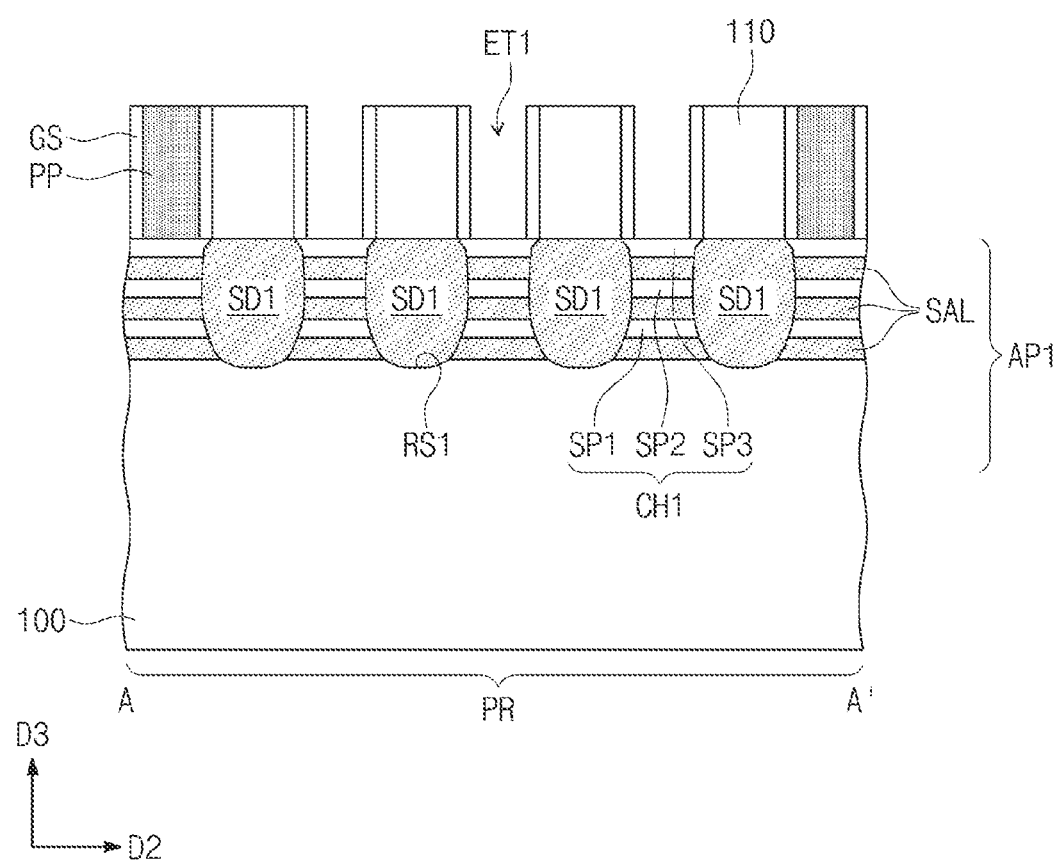
Figure 8B:
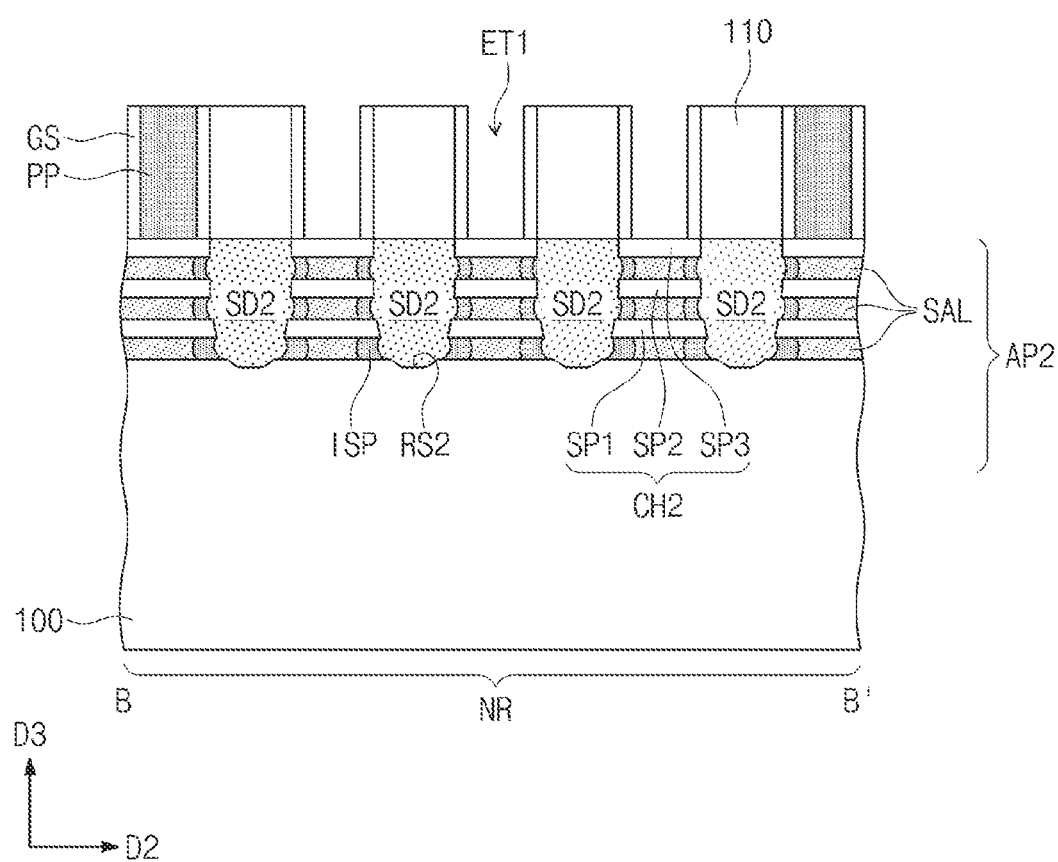
Figure 8C:
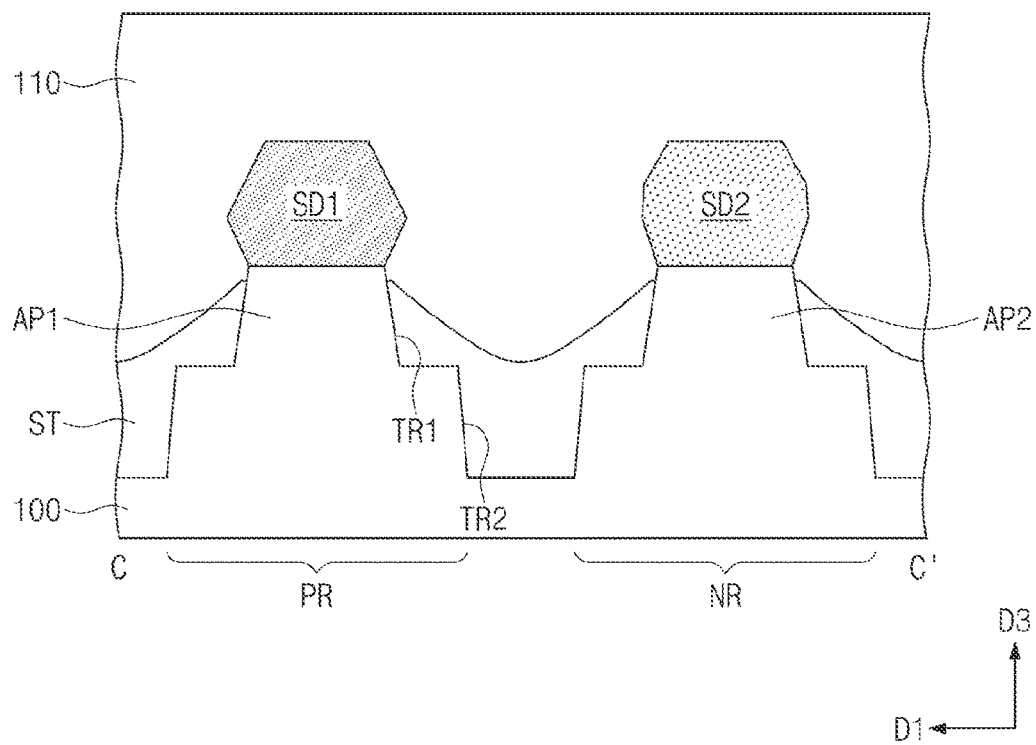
Figure 8D:
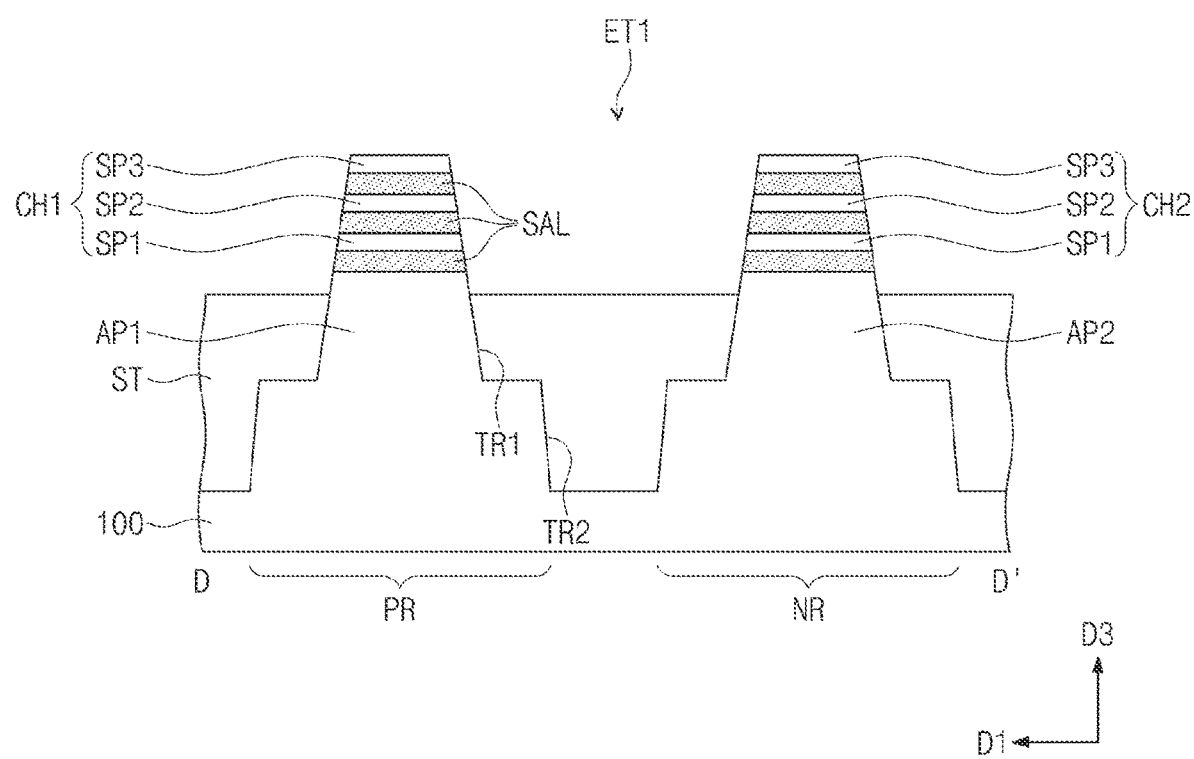

FIGS. 11, 12, 13, 14 and 15 are respective, enlarged, cross-sectional views of area 'N' indicated in FIGS. 6B and 7B further illustrating a method of forming an inner spacer according to embodiments of the inventive concept.

Figure 4A:
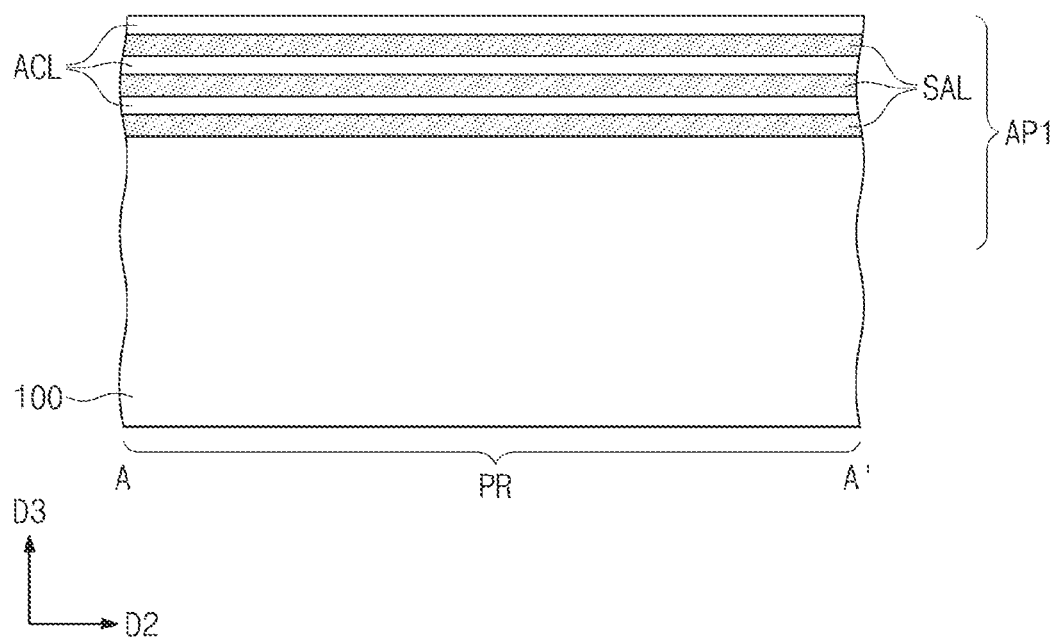
Figure 4B:
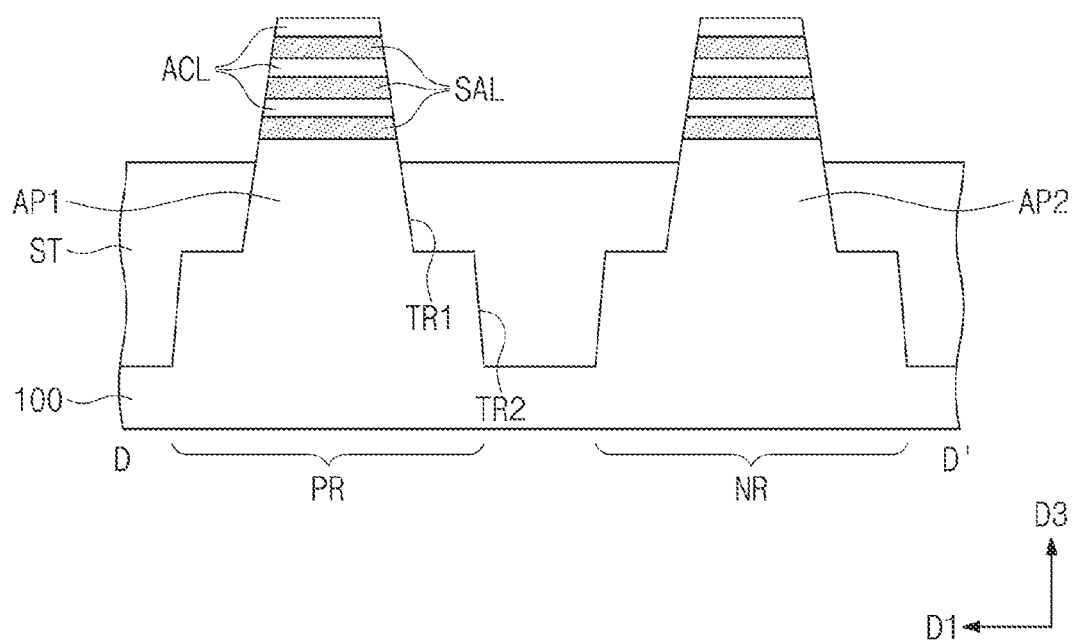

Referring to FIGS. 4A and 4B, a substrate 100 may be provided which includes a PMOSFET region PR and an NMOSFET region NR. Sacrificial layers SAL and active layers ACL may be alternately formed and stacked on the substrate 100. The sacrificial layers SAL may include one of silicon (Si), germanium (Ge), and silicon-germanium (SiGe), and the active layers ACL may include another of silicon (Si), germanium (Ge), and silicon-germanium (SiGe).

For example, the sacrificial layers SAL may include silicon-germanium (SiGe), and the active layers ACL may include silicon (Si).

Mask patterns may be correspondingly formed on the PMOSFET and NMOSFET regions PR and NR of the substrate 100. The mask patterns may each have a linear or bar shape that extends in a second direction D2.

A first patterning process may be performed in which the mask patterns are used as an etching mask to form a first trench TR1 that defines a first active pattern AP1 and a second active pattern AP2. The first active pattern AP1 and the second active pattern AP2 may be respectively formed on the PMOSFET region PR and the NMOSFET region NR. Each of the first and second active patterns AP1 and AP2 may include the sacrificial layers SAL and the active layers ACL that are alternately stacked on an upper portion thereof.

The substrate 100 may undergo a second patterning process to form a second trench TR2 that defines the PMOSFET region PR and the NMOSFET region NR. The second trench TR2 may be formed deeper than the first trench TR1.

A device isolation layer ST may be formed on the substrate 100, filling the first and second trenches TR1 and TR2. For example, a dielectric layer may be formed on the substrate 100, covering the first and second active patterns AP1 and AP2. The dielectric layer may be recessed until the sacrificial layers SAL are exposed, which may result in the formation of the device isolation layer ST.

The device isolation layer ST may include a dielectric material, such as a silicon oxide layer. Each of the first and second active patterns AP1 and AP2 may have an upper portion that is exposed above the device isolation layer ST. For example, the upper portion of each of the first and second active patterns AP1 and AP2 may protrude vertically upwards from the device isolation layer ST.

Figure 5A:
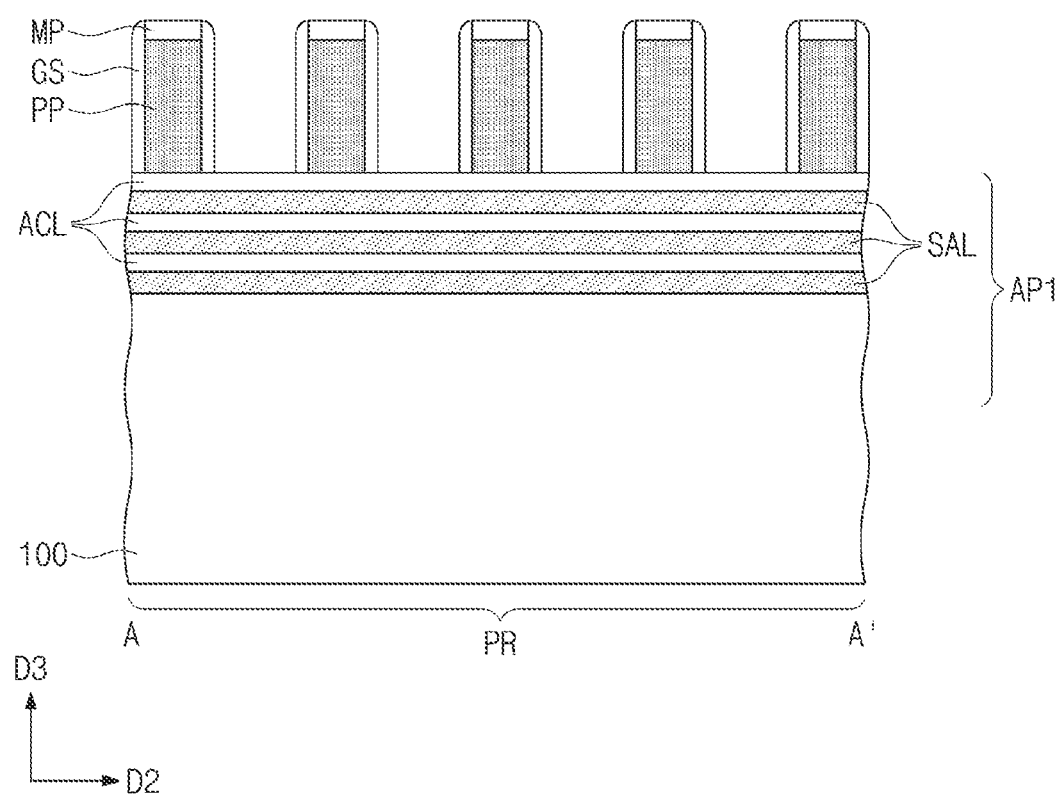
Figure 5B:
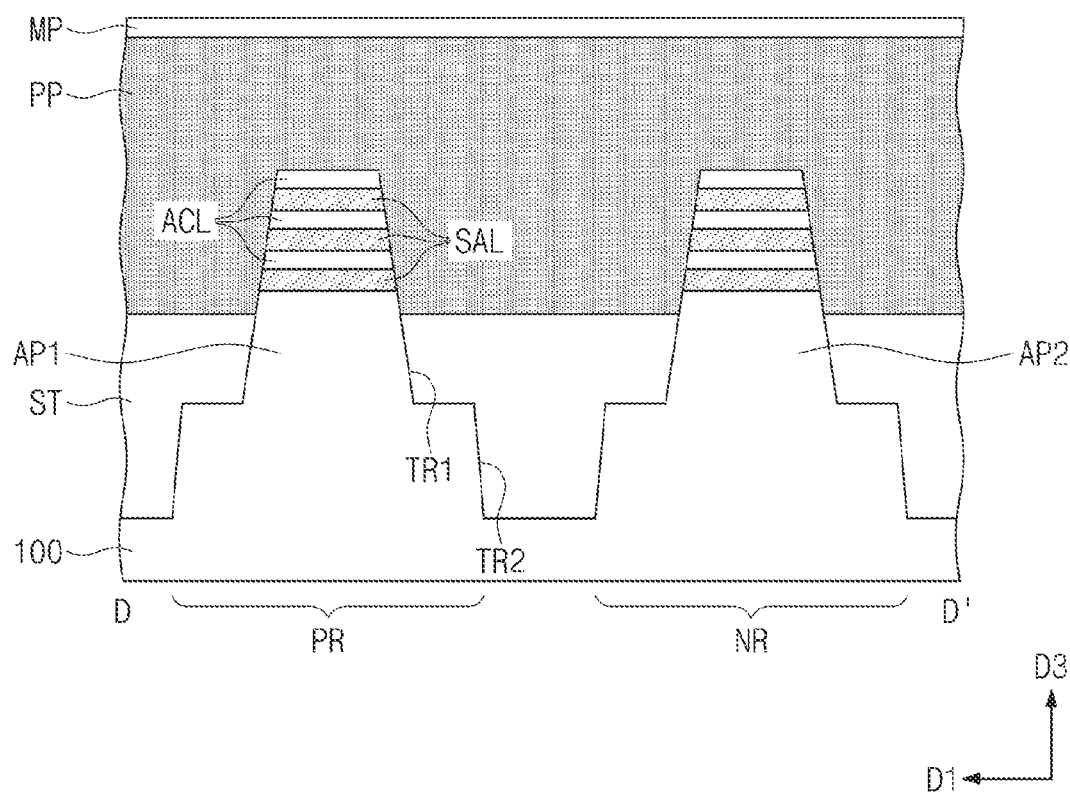

Referring to FIGS. 5A and 5B, sacrificial patterns PP may be formed on the substrate 100 running across the first and second active patterns AP1 and AP2. Each of the sacrificial patterns PP may be formed to have a linear or bar shape extending in the first direction D1. The sacrificial patterns PP may be arranged at a certain pitch along the second direction D2.

For example, the formation of the sacrificial patterns PP may include forming a sacrificial layer on an entire surface of the substrate 100, forming hardmask patterns MP on the sacrificial layer, and using the hardmask patterns MP as an etching mask to pattern the sacrificial layer. In some embodiments, the sacrificial layer may include polysilicon.

A pair of gate spacers GS may be formed on opposite sidewalls of each of the sacrificial patterns PP. The formation of the gate spacers GS may include conformally forming a gate spacer layer on the entire surface of the substrate 100 and anisotropically etching the gate spacer layer. The gate spacer layer may include at least one of SiCN, SiCON, and SiN. Alternately, the gate spacer layer may be a multi-layer including at least two of SiCN, SiCON, and SiN.

Referring to FIGS. 6A, 6B, 6C and 6D, first recessions RS1 may be formed on the upper portion of the first active pattern AP1. Second recessions RS2 may be formed on the upper portion of the second active pattern AP2. While the first and second recessions RS1 and RS2 are formed, the device isolation layer ST may be recessed on opposite sides of each of the first and second active patterns AP1 and AP2. (See, e.g., FIG. 6C).

The formation of the first recessions RS1 may include using the hardmask patterns MP and the gate spacers GS as an etching mask to etch the upper portion of the first active pattern AP1. The first recession RS1 may be formed between a pair of sacrificial patterns PP. The second recessions RS2 on the upper portion of the second active pattern AP2 may be formed by the same method used for forming the first recessions RS1. The first and second recessions RS1 and RS2 may form a first semiconductor pattern SP1, a second semiconductor pattern SP2, and a third semiconductor pattern SP3.

Referring to FIGS. 7A, 7B, 7C and 7D, first source/drain patterns SD1 may be formed in corresponding first recessions RS1. For example, a selective epitaxial growth (SEG) process may be performed in which an inner wall of the first recession RS1 is used as a seed layer to form the first source/drain pattern SD1. The first source/drain pattern SD1 may be grown from a seed, or the substrate 100 and the first, second, and third semiconductor patterns SP1, SP2, and SP3 exposed to the first recession RS1. The formation of the first source/drain patterns SD1 may define a first channel pattern CH1 between a pair of first source/drain patterns SD1. For example, the SEG process may include chemical vapor deposition (CVD) or molecular beam epitaxy (MBE). The first source/drain patterns SD1 may include a semiconductor element (e.g., SiGe) whose lattice constant is greater than that of a semiconductor element of the substrate 100. Each of the first source/drain patterns SD1 may be formed of semiconductor layers.

For example, impurities may be in-situ implanted during the SEG process for forming the first source/drain patterns SD1. For another example, after the first source/drain pattern SD1 is formed, the first source/drain pattern SD1 may be implanted with impurities. The first source/drain pattern SD1 may be doped with impurities of first conductivity type (e.g., P-type).

Second source/drain patterns SD2 may be formed in corresponding second recessions RS2. For example, a selective epitaxial growth (SEG) process may be performed in which an inner wall of the second recession RS2 is used as a seed to form the second source/drain pattern SD2. For example, the second source/drain pattern SD2 may include the same semiconductor element (e.g., Si) as that of the substrate 100. The second source/drain pattern SD2 may be doped with impurities of second conductivity type (e.g., N-type). Inner spacers ISP may be formed between the second source/drain pattern SD2 and the sacrificial layers SAL. The formation of the inner spacers ISP and the second source/drain pattern SD2 will be further discussed in detail with reference to FIGS. 11, 12, 1, 3 14 and 15 hereafter.

Referring to FIGS. 8A, 8B, 8C and 8D, a first interlayer dielectric layer 110 may be formed to cover the first and second source/drain patterns SD1 and SD2, the hardmask patterns MP, and the gate spacers GS. For example, the first interlayer dielectric layer 110 may include a silicon oxide layer.

The first interlayer dielectric layer 110 may be planarized until top surfaces of the sacrificial patterns PP are exposed. An etch-back or chemical mechanical polishing (CMP) process may be employed to perform a planarization process on the first interlayer dielectric layer 110. The hardmask patterns MP may all be removed during the planarization process. As a result, the first interlayer dielectric layer 110 may have a top surface substantially coplanar with those of the sacrificial patterns PP and those of the gate spacers GS.

The exposed sacrificial patterns PP may be selectively removed. The removal of the sacrificial pattern PP may form first empty spaces ET1 that expose the first and second active patterns AP1 and AP2. (See, e.g., FIG. 8D).

In contrast, portions of the sacrificial patterns PP may not be removed. For example, there may be no removal of the sacrificial pattern PP positioned on a cell boundary. A mask layer may be formed on the sacrificial patterns PP that should not be removed. When the sacrificial pattern PP is removed, the first and second active patterns AP1 and AP2 may be exposed through the first empty space ET1. The first empty space ET1 may expose the sacrificial layers SAL of each of the first and second active patterns AP1 and AP2.

Referring to FIGS. 9A, 9B, 9C and 9D, the sacrificial layers SAL exposed through the first empty space ET1 may be selectively removed. For example, an etching process that selectively etches the sacrificial layers SAL may be performed such that the sacrificial layers SAL may be removed, and that the first, second, and third semiconductor patterns SP1, SP2, and SP3 may remain without being removed. In this case, the inner spacers ISP may prevent damage to the second source/drain pattern SD2.

The inner spacers ISP may be removed which are exposed due to the removal of the sacrificial layers SAL. For example, an etching process that selectively etches the inner spacers ISP may be performed such that the inner spacers ISP may be removed, and that the first, second, and third semiconductor patterns SP1, SP2, and SP3 may remain without being removed.

Figure 9A:
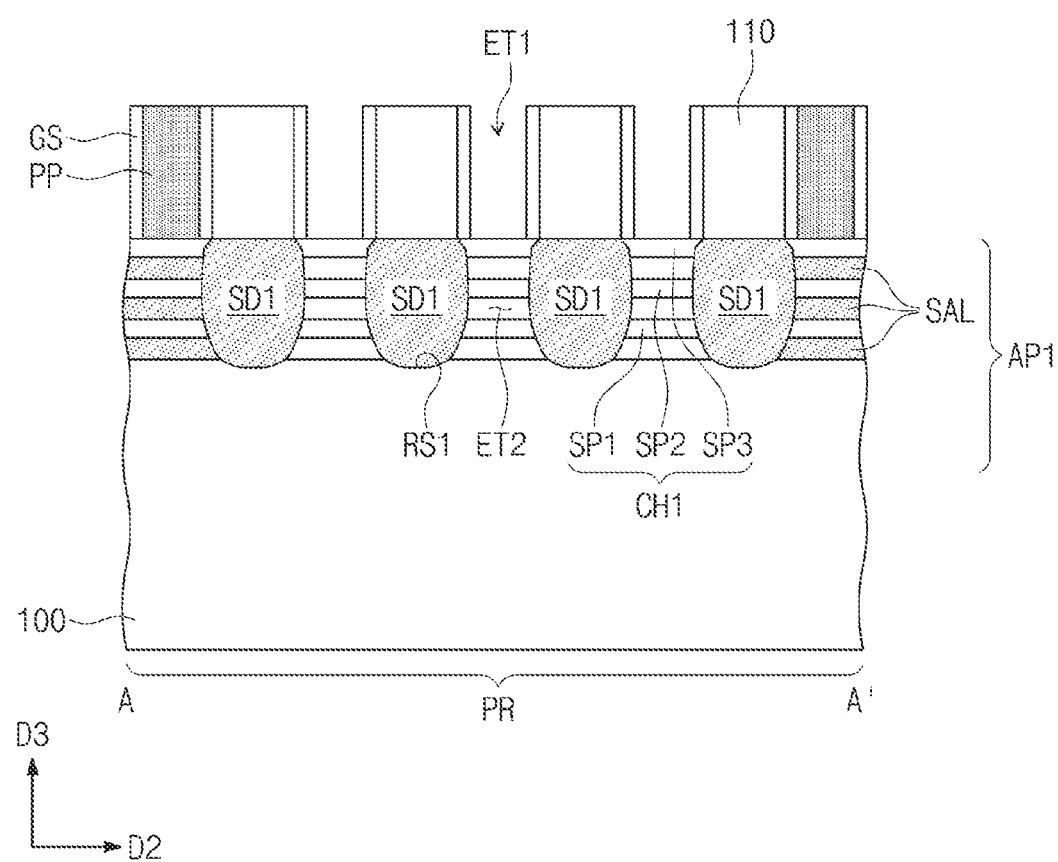
Figure 9B:
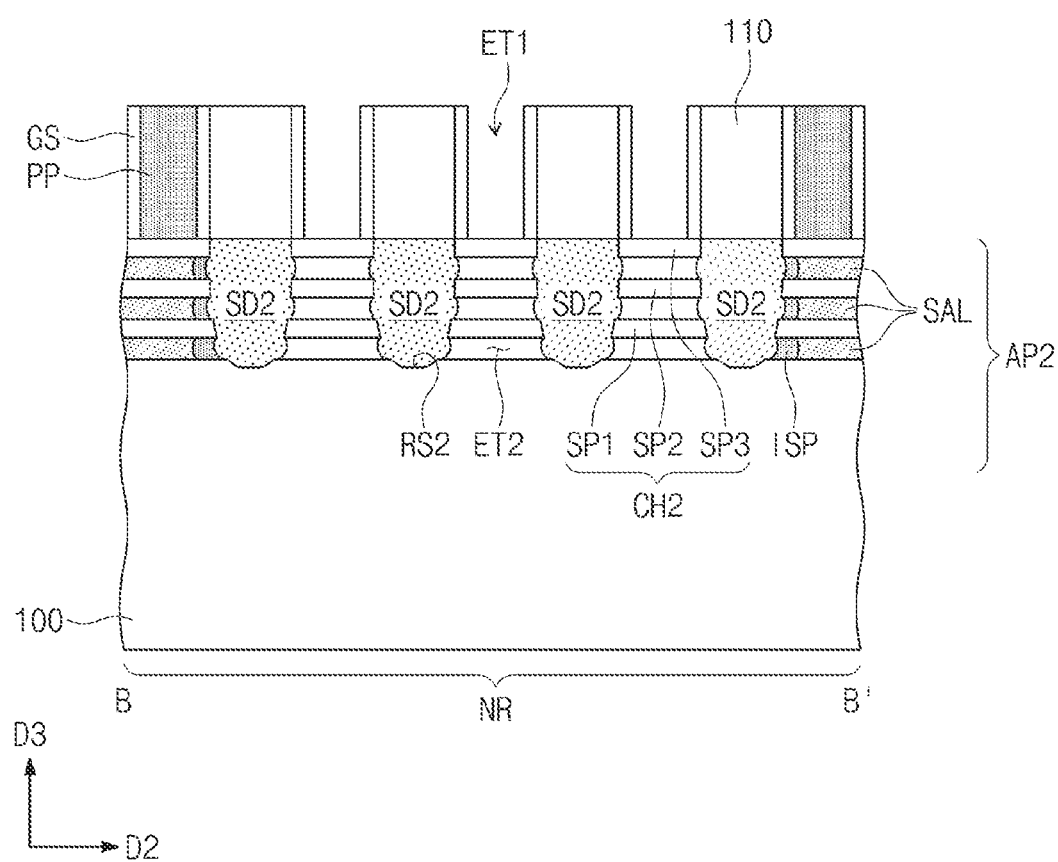
Figure 9C:
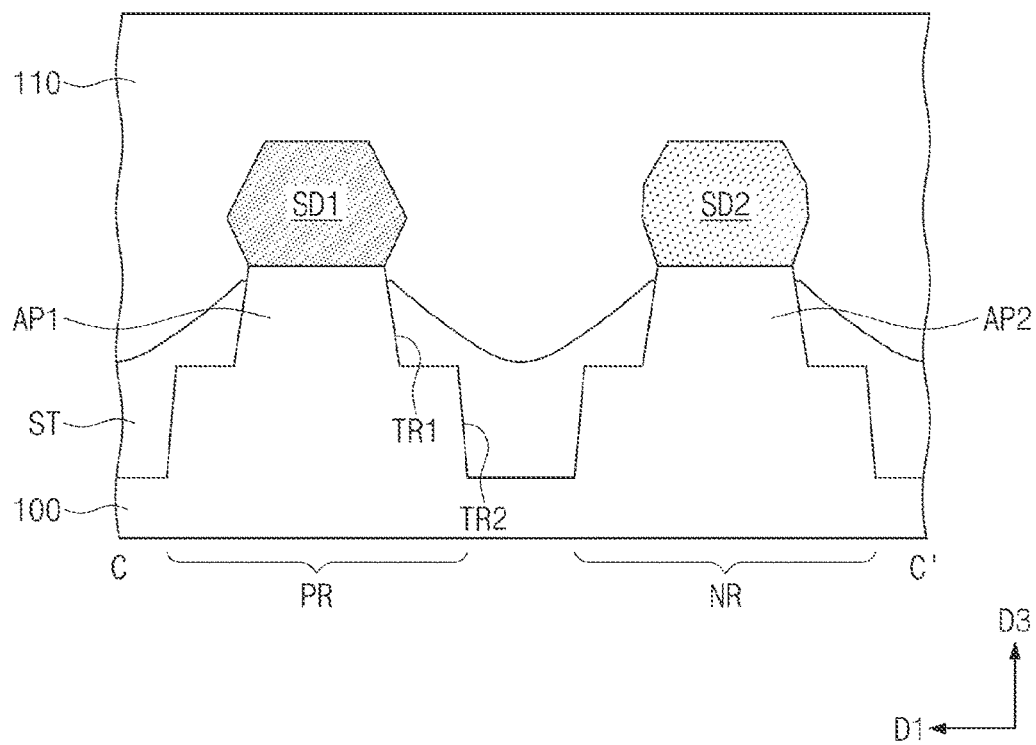
Figure 9D:
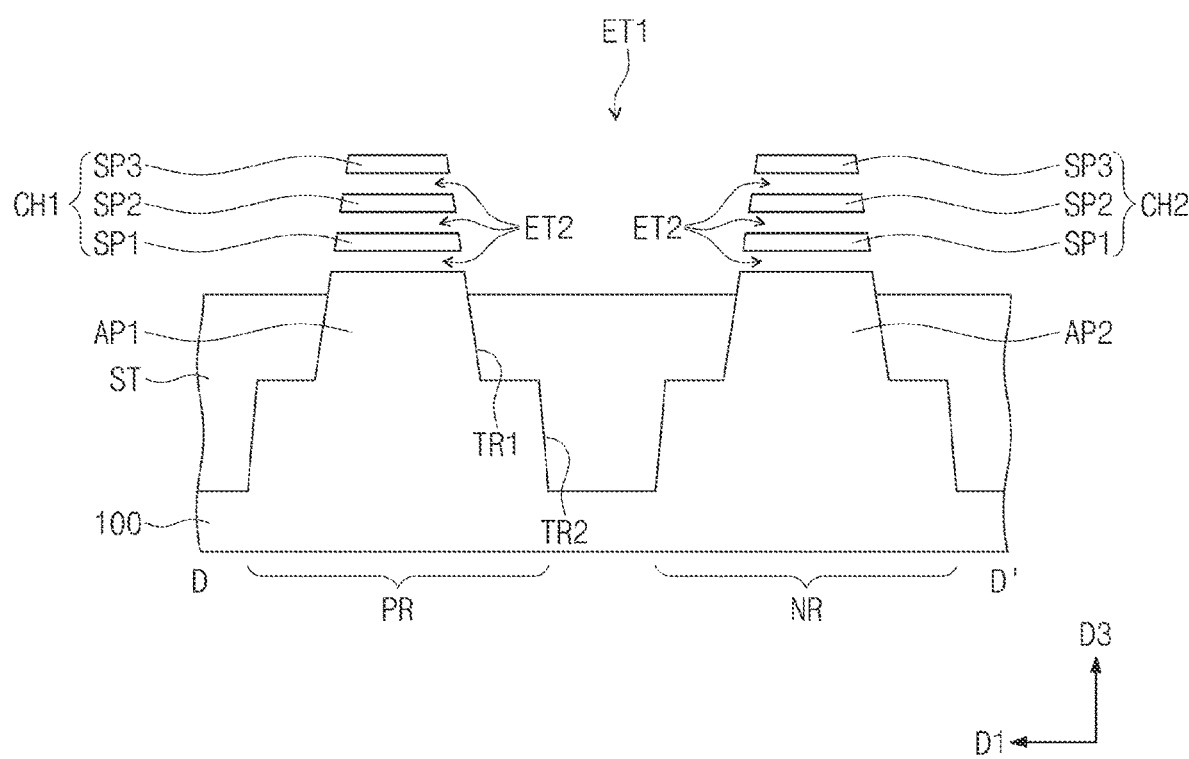
Figure 10A:
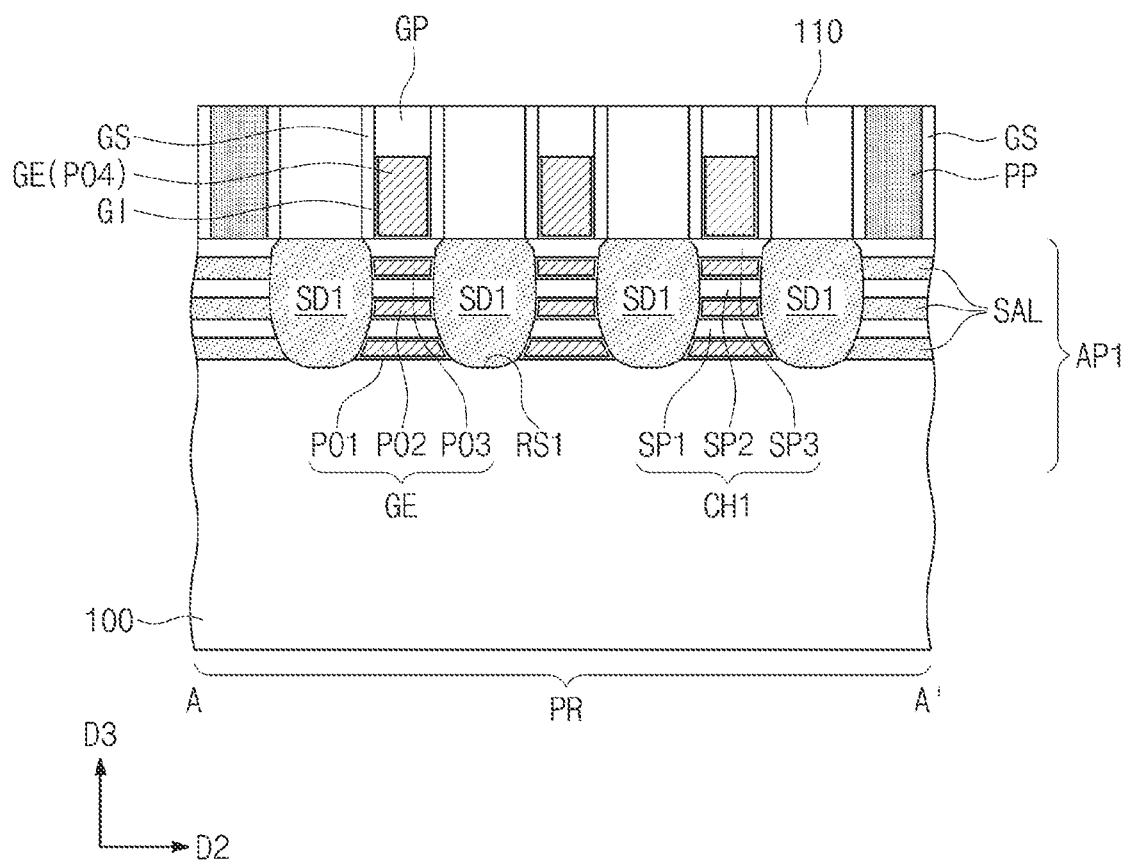
Figure 10B:
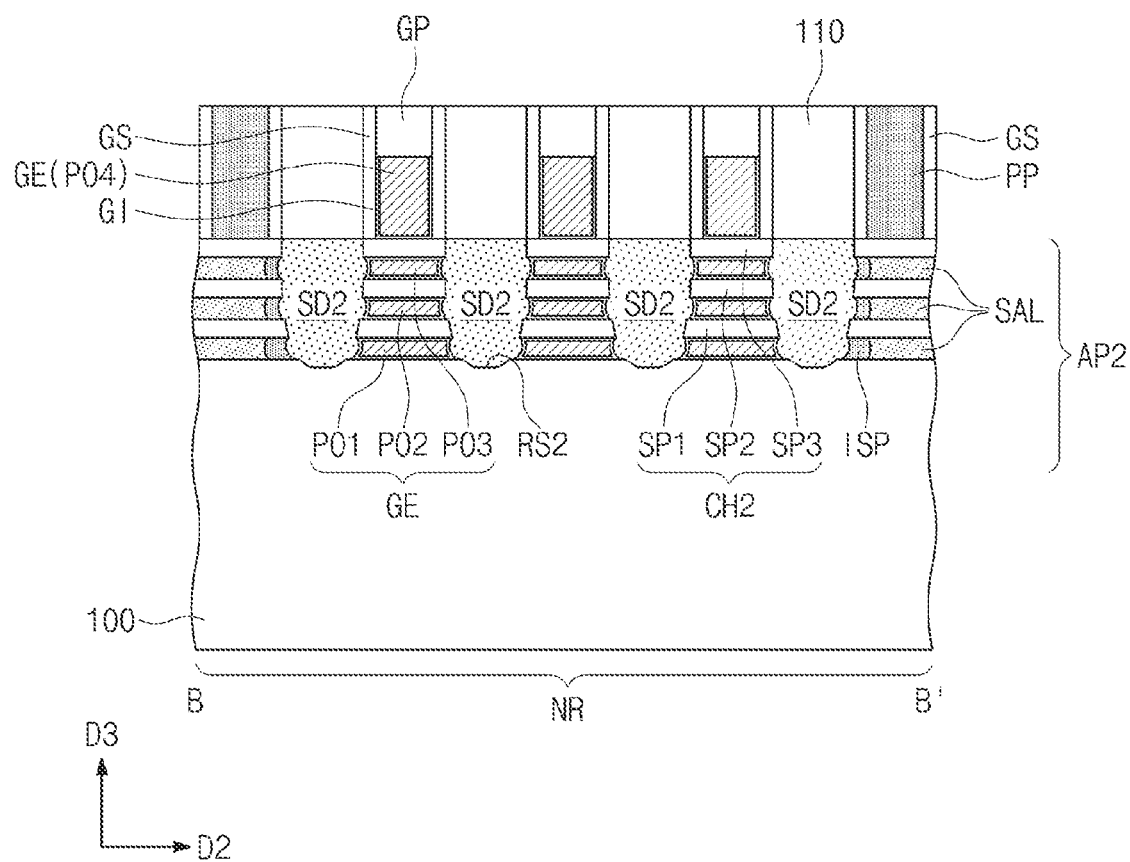
Figure 10C:
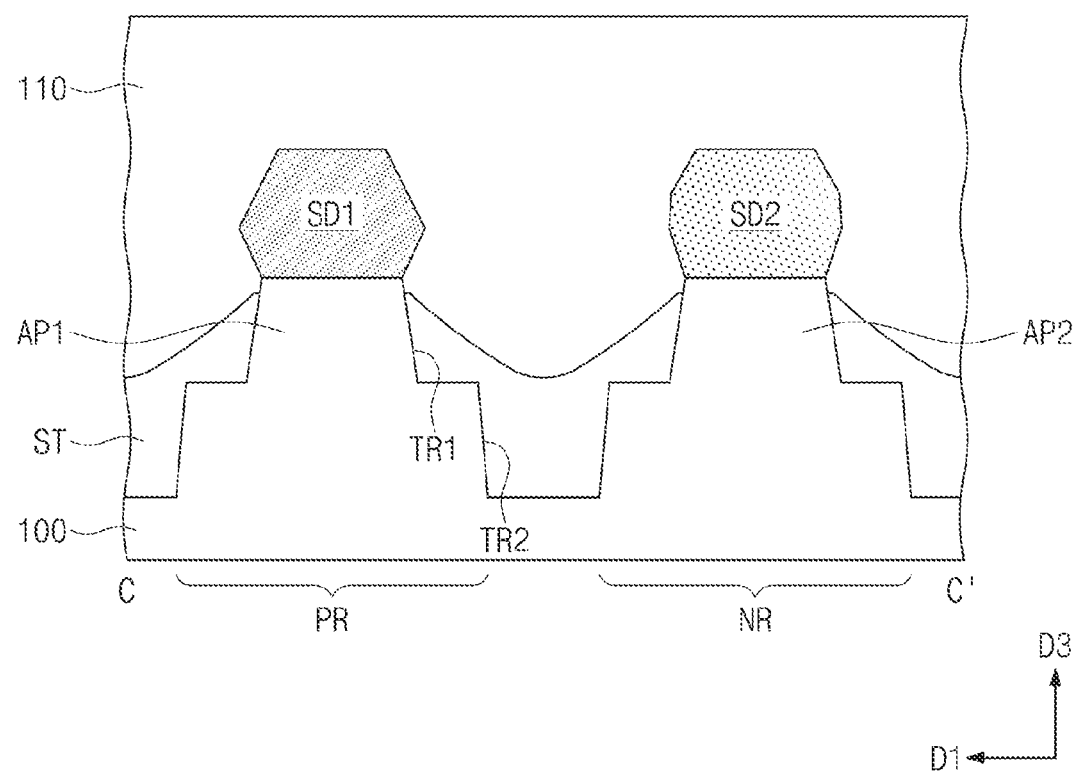
Figure 10D:
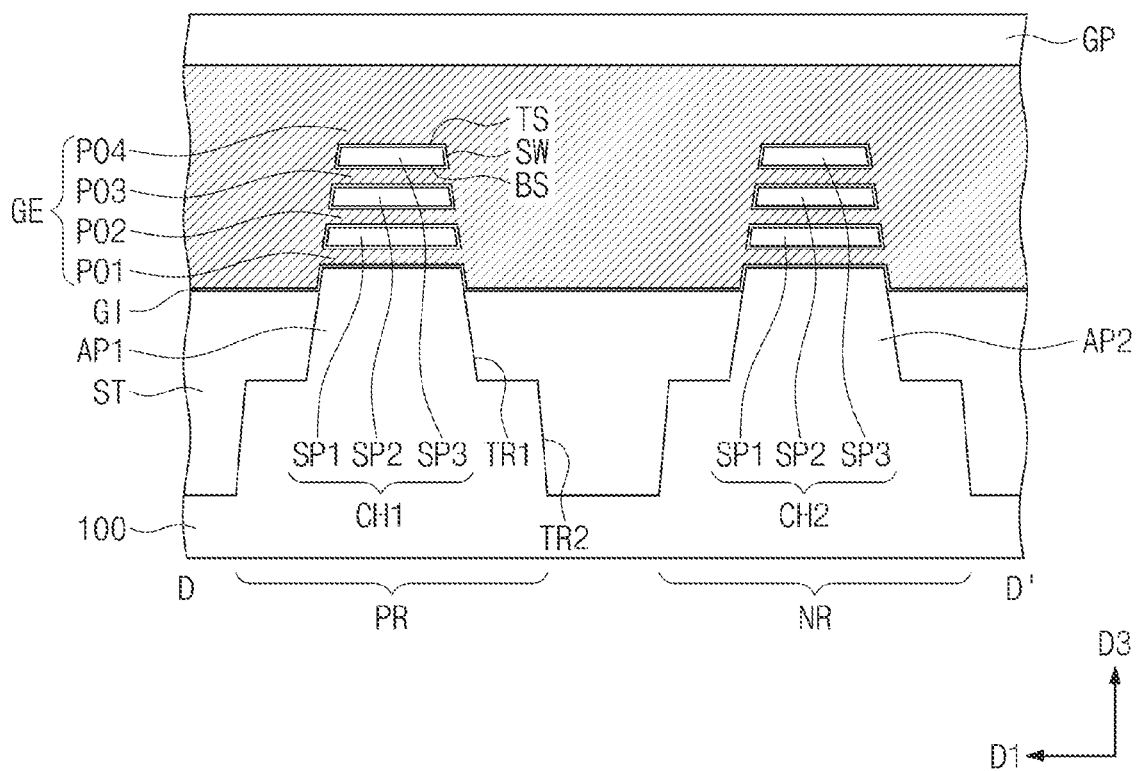

Referring to FIG. 9D, the selective removal of the sacrificial layers SAL and the inner spacers ISP may leave the first, second, and third semiconductor patterns SP1, SP2, and SP3 on each of the first and second active patterns AP1 and AP2. Second empty spaces ET2 may be formed on regions from which the sacrificial layers SAL and the inner spacers ISP are removed. The second empty spaces ET2 may be defined between the first, second, and third semiconductor patterns SP1, SP2, and SP3.

Referring to FIGS. 10A, 10B, 10C and 10D, a gate dielectric layer GI may be conformally formed in the first and second empty spaces ET1 and ET2. A gate electrode GE may be formed on the gate dielectric layer GI. The gate electrode GE may be formed to fill the first and second empty spaces ET1 and ET2. For example, the gate electrode GE may include first, second, and third parts PO1, PO2, and PO3 that fill the second empty spaces ET2. The gate electrode GE may further include a fourth part PO4 that fills the first empty space ET1. A gate capping pattern GP may be formed on the gate electrode GE.

Referring to FIGS. 1 and 2A to 2D, a second interlayer dielectric layer 120 may be formed on the first interlayer dielectric layer 110. The second interlayer dielectric layer 120 may include a silicon oxide layer. Active contacts AC may be formed to penetrate the second and first interlayer dielectric layers 120 and 110 and to have electrical connection with the first and second source/drain patterns SD1 and SD2. A gate contact GC may be formed to penetrate the second interlayer dielectric layer 120 and the gate capping pattern GP and to have electrical connection with the gate electrode GE.

A pair of separation structures DB may be formed on opposite sides of a logic cell LC. The separation structure DB may penetrate the second interlayer dielectric layer 120, the remaining sacrificial pattern PP, and the upper portion of the active pattern AP1 or AP2 below the sacrificial pattern PP. The separation structure DB may include a dielectric material, such as a silicon oxide layer or a silicon nitride layer.

A third interlayer dielectric layer 130 may be formed on the active contacts AC and the gate contacts GC. A first metal layer M1 may be formed in the third interlayer dielectric layer 130. A fourth interlayer dielectric layer 140 may be formed on the third interlayer dielectric layer 130. A second metal layer M2 may be formed in the fourth interlayer dielectric layer 140.

Figure 11:
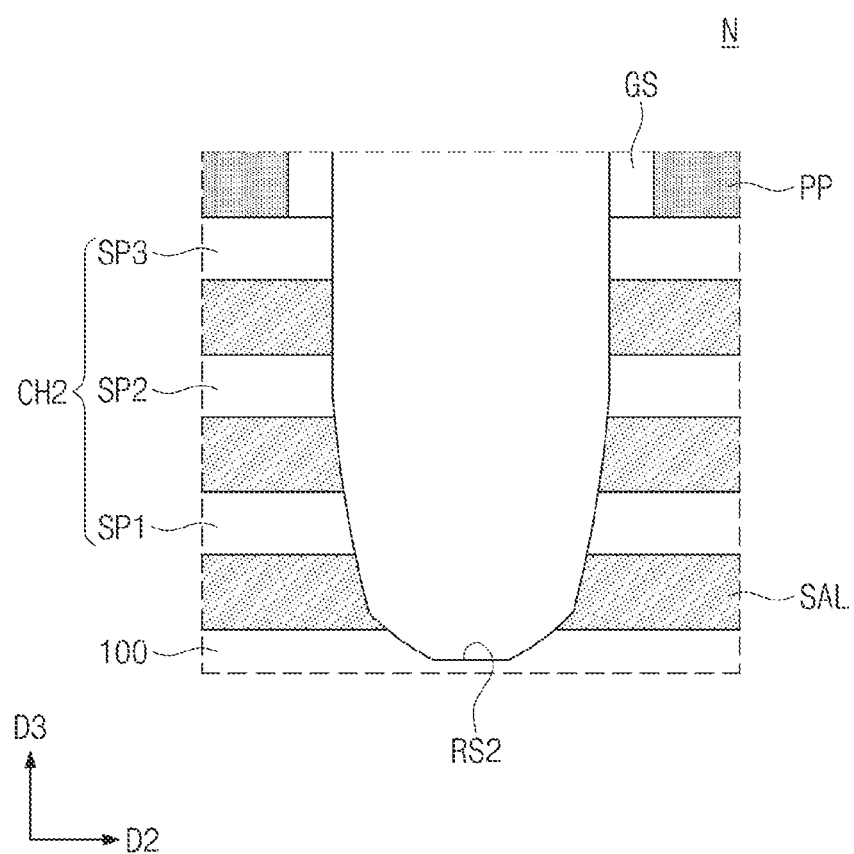
FIGS. 11, 12, 13, 14 and 15 are respective, enlarged cross-sectional views further illustrating the area 'N' indicated in FIGS. 6B and 7B.

With reference to FIGS. 11, 12, 13, 14 and 15, a description of the formation of the inner spacers ISP and the second source/drain pattern SD2 according to certain embodiments of the inventive concept will be provided. Referring to FIG. 11, a second recession RS2 may be formed between a pair of sacrificial patterns PP to a defined "depth" in the third direction D3 and a defined "width" in the second direction D2. Thus, the second recession RS2 may expose a portion of the substrate 100, as well as sidewalls of the first, second, and third semiconductor patterns SP1, SP2, and SP3 and intervening sacrificial layers SAL.

Figure 12:
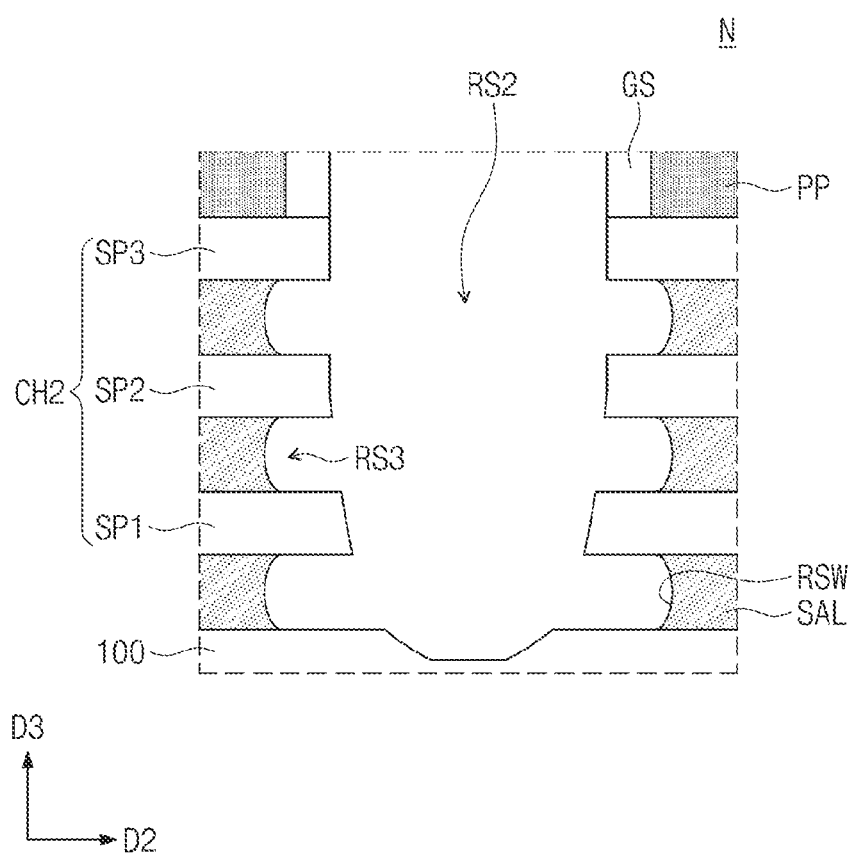

Referring to FIG. 12, an isotropic etching process may be performed to selectively etch the exposed sidewall surfaces of the intervening sacrificial layers SAL. For example, a wet etching process may be performed through the second recession RS2 to laterally recess (in the second direction D2) the exposed sidewalls of the intervening sacrificial layers SAL. This selective recessing of the sacrificial layers SAL may be understood as forming third recessions RS3, wherein each of the third recessions RS3 is a horizontally recessed region in a direction away from the second recession RS2. That is, the third recessions RS3 form recessed sidewalls RSW for each of the sacrificial layers SAL.

Figure 13:
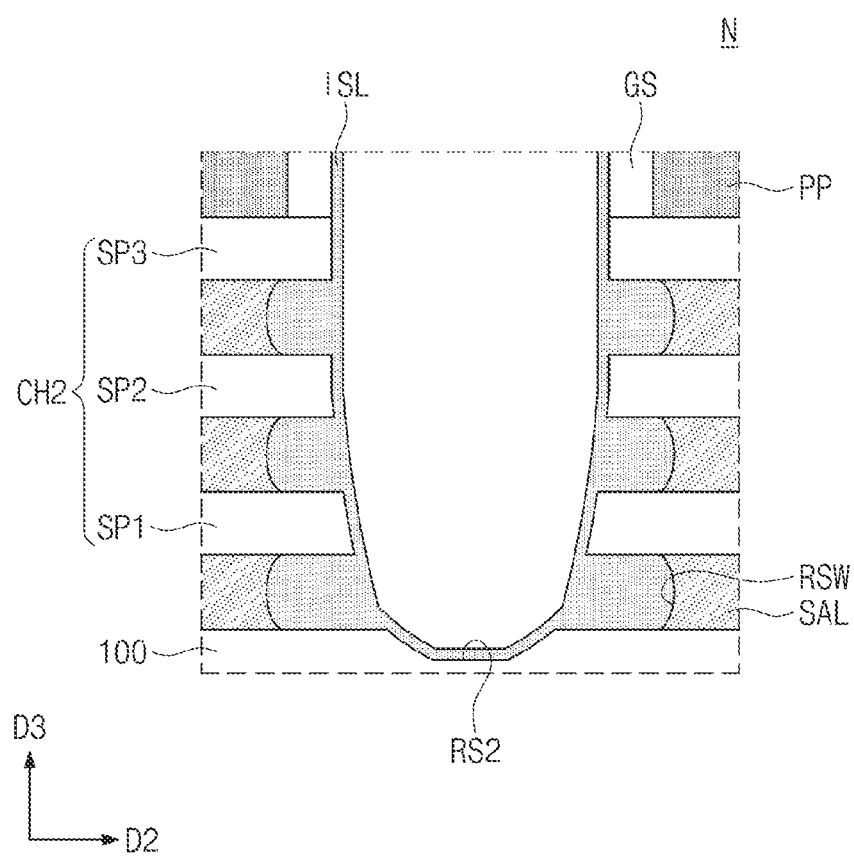

Referring to FIG. 13, an inner dielectric layer ISL may be formed in the second and third recessions RS2 and RS3. In this regard, the inner dielectric layer ISL may be formed to substantially or completely fill the third recession RS3. For example, the inner dielectric layer ISL may include silicon nitride. Hence, the inner dielectric layer ISL may include a segment that is conformally formed along the profile of the second recession RS2, as well as substantially filling the third recessions RS3.

Figure 14:
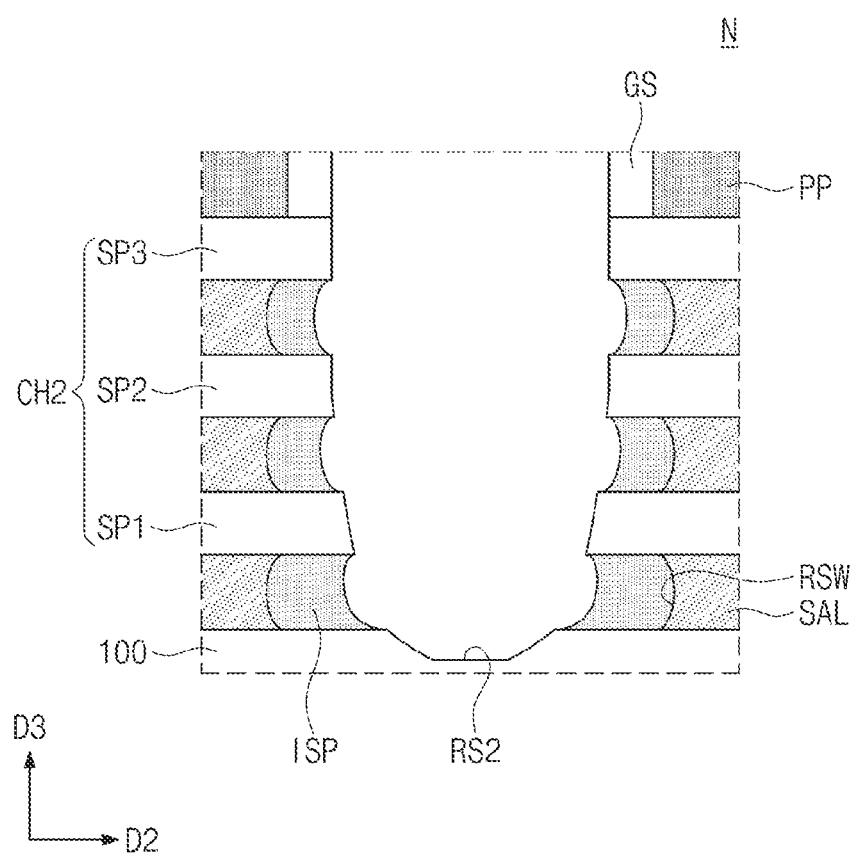

Referring to FIG. 14, an etching process may be performed to selectively etch the inner dielectric layer ISL. The etching process may continue until sidewalls of the first, second, and third semiconductor patterns SP1, SP2, and SP3 are again exposed.

In this context, the inner dielectric layer ISL may be recessed to form inner spacers ISP. The inner spacers ISP may be interposed between the substrate 100 and the first semiconductor pattern SP1, between the first semiconductor pattern SP1 and the second semiconductor pattern SP2, and between the second semiconductor pattern SP2 and the third semiconductor pattern SP3. The inner spacers ISP may have non-linear sidewall profiles. For example, the inner spacers ISP may be horizontally recessed in a direction away from the second recession RS2. The inner spacers ISP may be formed in the third recession RS3.

Figure 15:
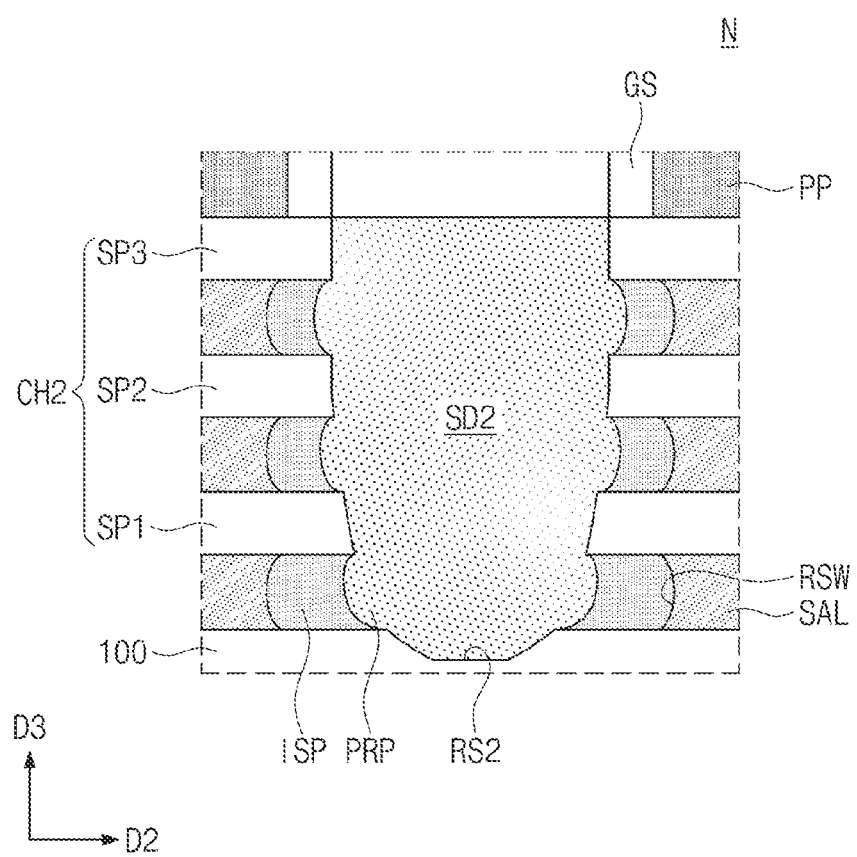

Referring to FIG. 15, a selective epitaxial growth (SEG) process may be performed in which the substrate 100 and the first, second, and third semiconductor patterns SP1, SP2, and SP3 exposed to the second recession RS2 are used as a seed to form a second source/drain pattern SD2. The second source/drain pattern SD2 may be in contact with the sidewalls of the inner spacers ISP. The second source/drain pattern SD2 may include protrusions PRP in contact with the sidewalls of the inner spacers ISP. The protrusions PRP may have their profiles that conform to those of the sidewalls of the inner spacers ISP.

Figure 16:
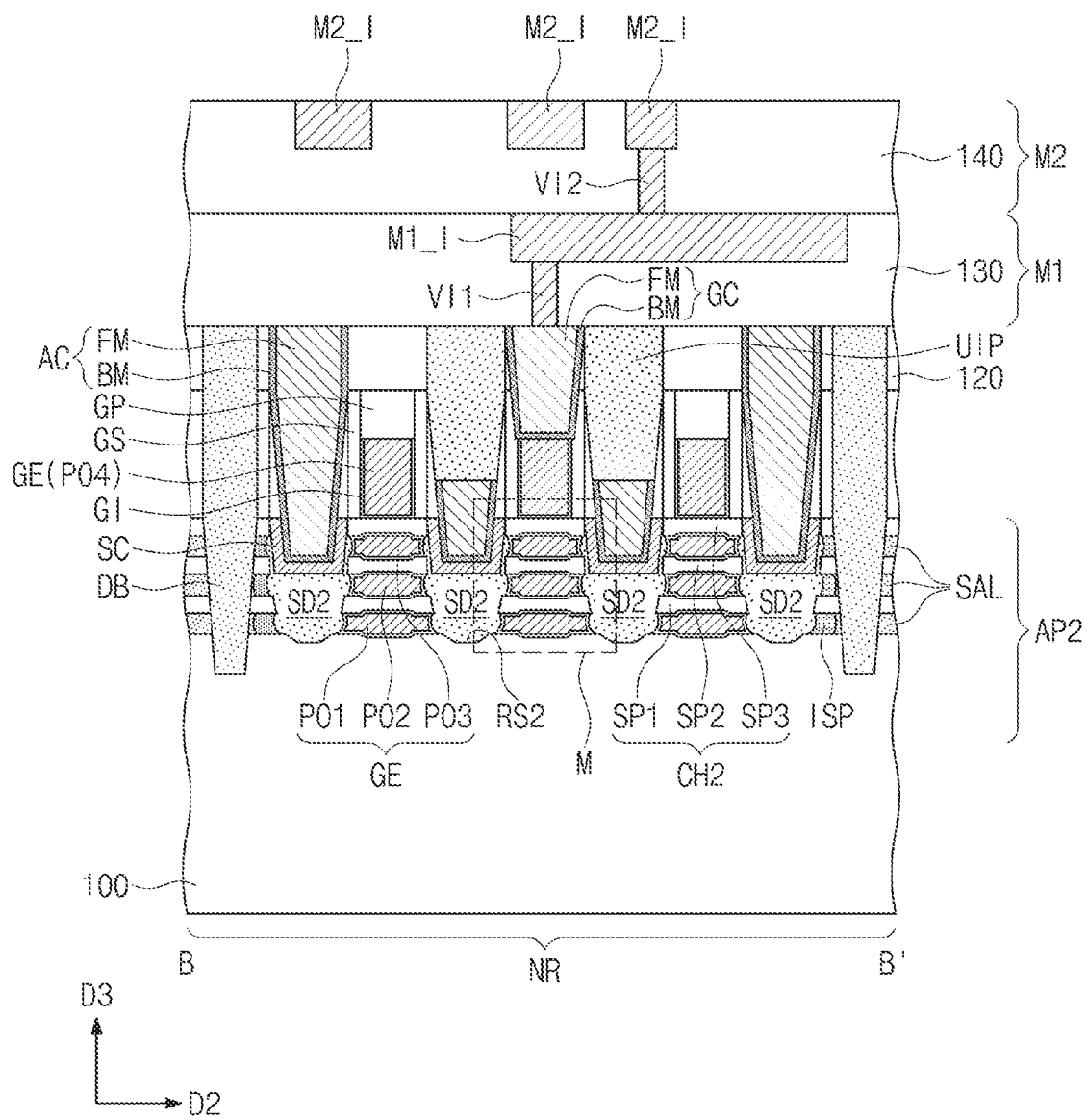
FIG. 16 is a cross-sectional view taken along line B-B' of FIG. 1 and illustrates a semiconductor device according to embodiments of the inventive concept.
Figure 17:
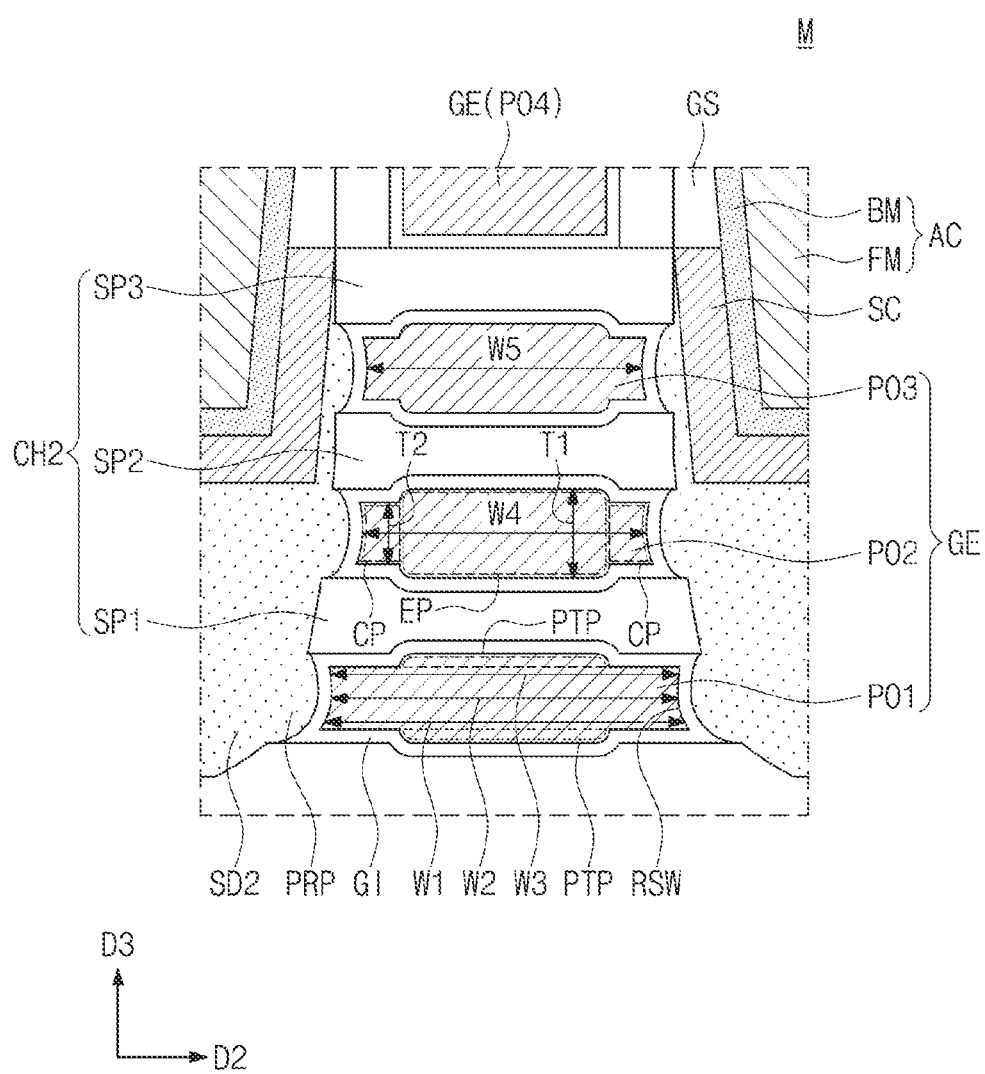
FIG. 17 is an enlarged cross-sectional view further illustrating the area 'M' indicated in FIG. 16.

FIG. 16 is a cross-sectional view taken along line B-B' of FIG. 1 and illustrates a semiconductor device according to embodiments of the inventive concept, and FIG. 17 is an enlarged cross-sectional view further illustrating area 'M' indicated in FIG. 16. Hereafter, only material differences between the embodiments of FIGS. 1 and 3 in comparison with the embodiments of FIGS. 16 and 17 will be described.

Referring to FIGS. 16 and 17, each of the first, second, and third parts PO1, PO2, and PO3 of the gate electrode GE may additionally include contact segments CP extending in the second direction D2 towards an adjacent second source/drain patterns SD2, and an extension segment EP protruding in the third direction to connect the contact segments CP.

In this regard, the contact segments CP may be horizontally offset from (e.g., horizontally extend beyond the sidewalls of) the fourth part PO4 of the gate electrode GE. Thus, the extension segments EP may vertically overlap the fourth part PO4 of the gate electrode GE.

Each of the contact segments CP may include a recessed sidewall RSW adjacent to the second source/drain pattern SD2. The extension segment EP may extend from the contact segment CP in a direction away from the recessed sidewall RSW. The extension segment EP may include protruding patterns PTP that protrude in the third direction D3 (e.g., a direction perpendicular to the top surface of the substrate 100). The protruding patterns PTP may be provided on upper and lower portions of each of the first, second, and third parts PO1, PO2, and PO3 of the gate electrode GE.

Thus, the extension segment EP may have a first thickness T1. The contact segment CP may have a second thickness T2, wherein the first thickness T1 may be greater than the second thickness T2. The extension segment EP may have a top surface whose uppermost level is higher than that of a top surface of the contact segment CP.

The protruding pattern PTP may have a non-linear profile. For example, the protruding pattern PTP may have a profile that is curved at a location where the contact segment CP is connected to the extension segment EP. Each of the first, second, and third semiconductor patterns SP1, SP2, and SP3 may have top and bottom surfaces each of which has a crooked profile. Each of the first, second, and third semiconductor patterns SP1, SP2, and SP3 may have a larger thickness at a portion that vertically overlaps the contact segment CP and a smaller thickness at a portion that vertically overlaps the extension segment EP.

The first part PO1 of the gate electrode GE may have a width in the second direction D2 that varies with its depth in the third direction D3. For example, the width of the first part PO1 may decrease to a minimum value and then may increase again as a function of positional location along the depth of the third direction D3. The first part PO1 may have a first width W1 at its lower portion, a second width W2 at its middle portion, and a third width W3 at its upper portion. The second width W2 may be less than the first width W1, and the third width W3 may be greater than the second width W2. The third width W3 may be less than the first width W1. For example, the first part PO1 may have at its middle portion a minimum width or the second width W2.

A minimum width of the second part PO2 may be a fourth width W4, and a minimum width of the third part PO3 may be a fifth width W5. The first, second, and third parts PO1, PO2, and PO3 may have their minimum widths different from each other. For example, the minimum width W2 of the first part PO1 may be greater than the minimum width W4 of the second part PO2, and the minimum width W4 of the second part PO2 may be greater than the minimum width W5 of the third part PO3. The first, second, and third parts PO1, PO2, and PO3 may have their minimum widths that decrease in the third direction D3. Each of the second and third parts PO2 and PO3 of the gate electrode GE may have a width that decreases to a minimum value and then increases in the third direction D3.

In the foregoing description, the width in the second direction D2 of each of the first, second, and third parts PO1, PO2, and PO3 may vary at portion(s) other than the protruding pattern PTP. For example, a width in the second direction D2 of each of the first, second, and third parts PO1, PO2, and PO3 may mean a width at the same level as that of the protrusions PRP of the second source/drain pattern SD2.

Figure 18:
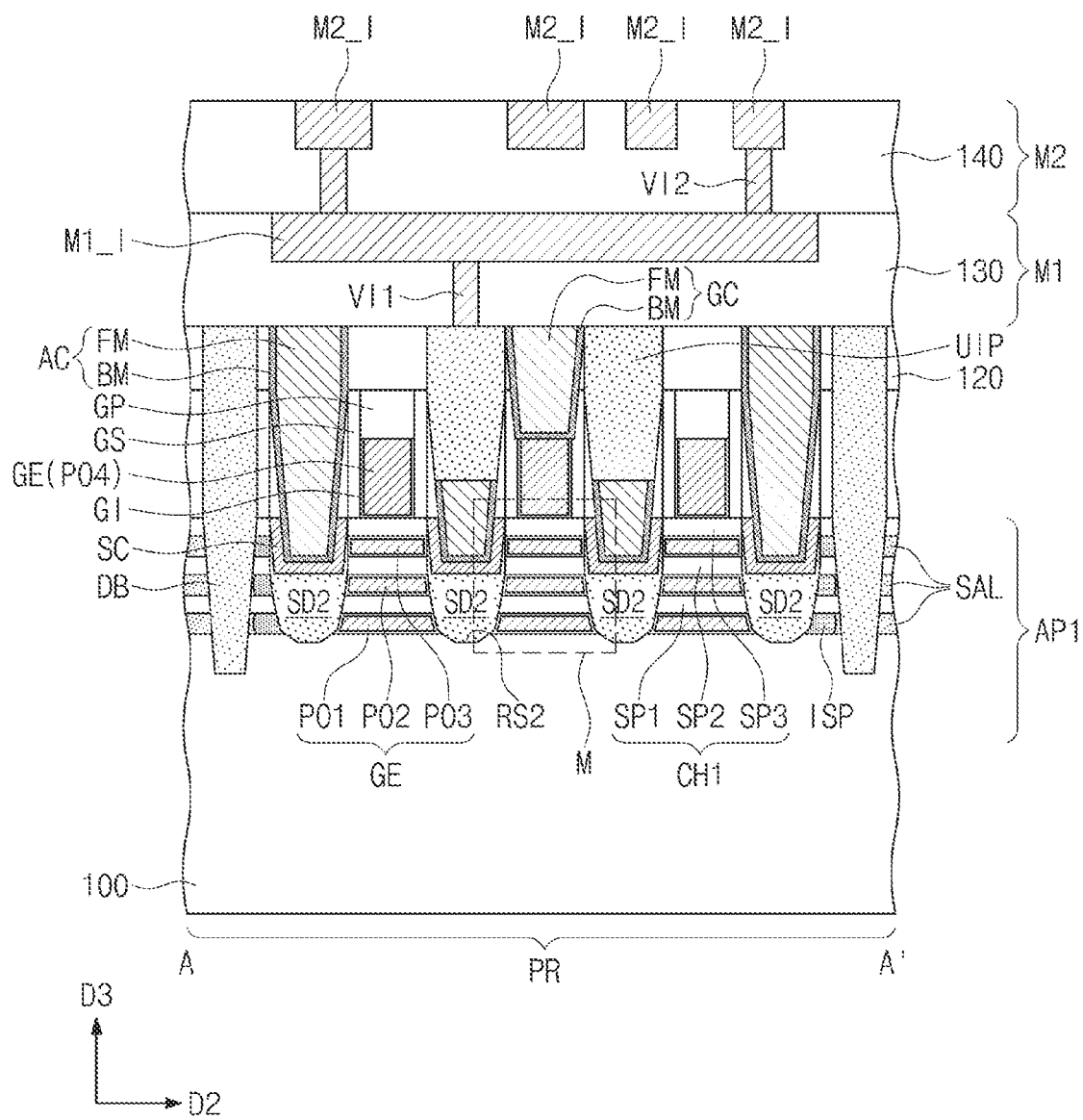
FIG. 18 is a cross-sectional view taken along line B-B' of FIG. 1 and illustrates a semiconductor device according to embodiments of the inventive concept.
Figure 19:
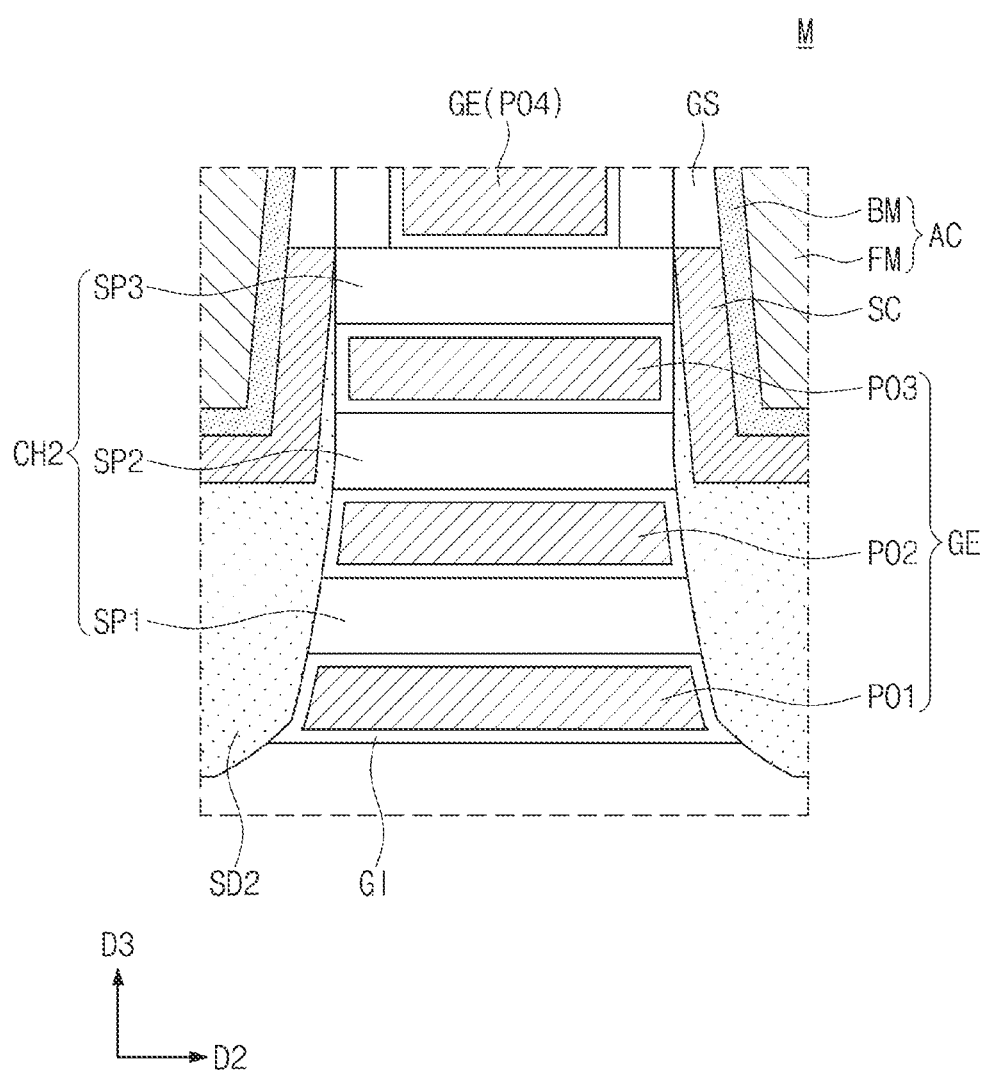
FIG. 19 is an enlarged cross-sectional view further illustrating the area 'M' indicated in FIG. 18.

FIG. 18 is a cross-sectional view taken along line B-B' of FIG. 1 and illustrates a semiconductor device according to embodiments of the inventive concept, and FIG. 19 is an enlarged cross-sectional view further illustrating the area 'M' indicated in FIG. 18. Hereafter, only material differences between the embodiments of FIGS. 1 and 3 in comparison with the embodiments of FIGS. 18 and 19 will be described.

Referring to FIGS. 18 and 19, on the NMOSFET region NR, the first, second, and third parts PO1, PO2, and PO3 of the gate electrode GE may have different, respective widths in the second direction. For example, a maximum width of the third part PO3 may be less than a maximum width of the second part PO2. The maximum width of the second part PO2 may be less than a maximum width of the first part PO1.

In contrast to the embodiment of FIG. 3, the second source/drain pattern SD2 may not include the protrusions PRP. Although not shown, each of the first, second, and third parts PO1, PO2, and PO3 of the gate electrode GE may include the protruding patterns PTP discussed with reference to FIGS. 16 and 17.

Figure 20:
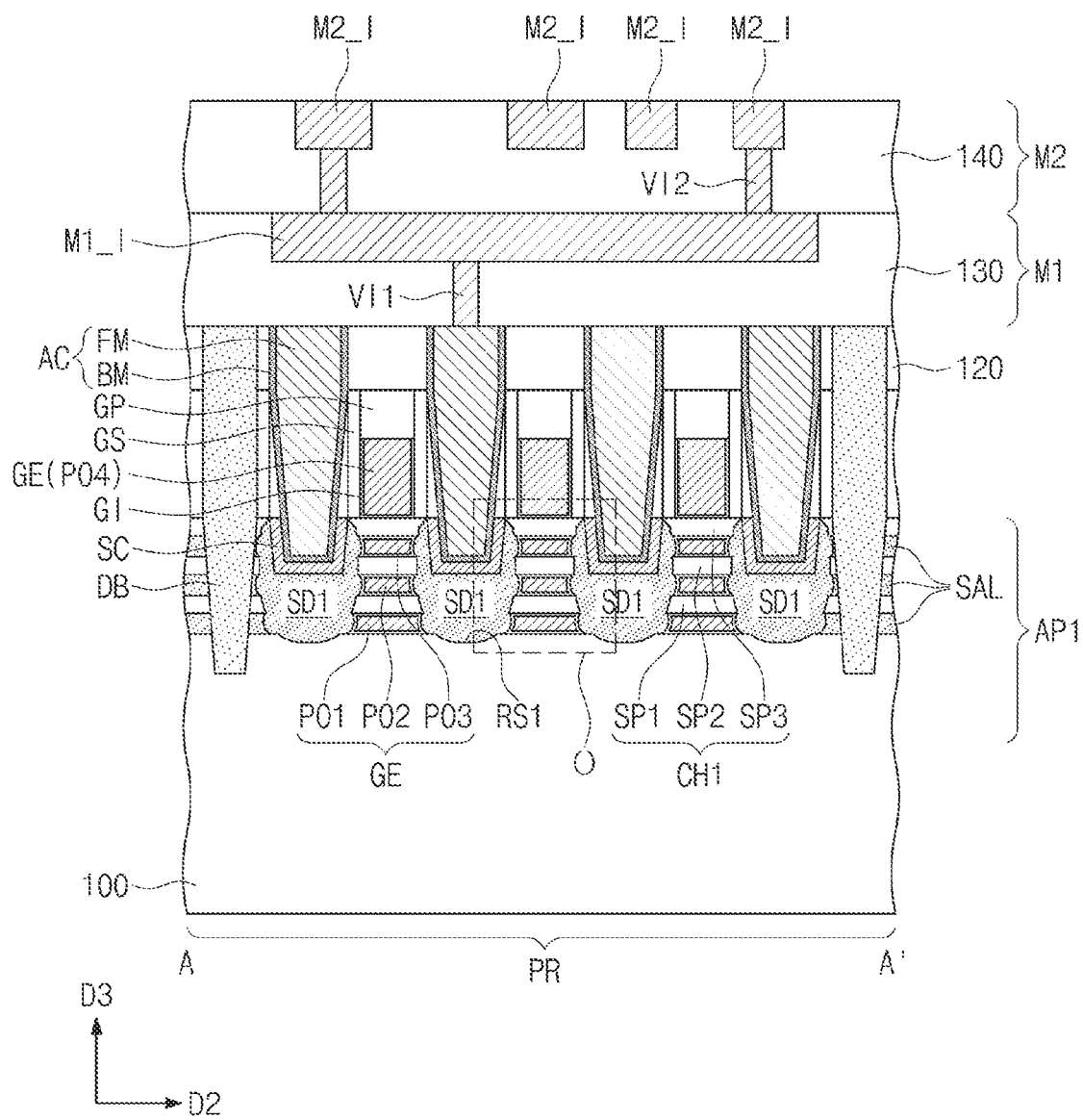
FIG. 20 is a cross-sectional view taken along line A-A' of FIG. 1 and illustrates a semiconductor device according to embodiments of the inventive concept.
Figure 21:
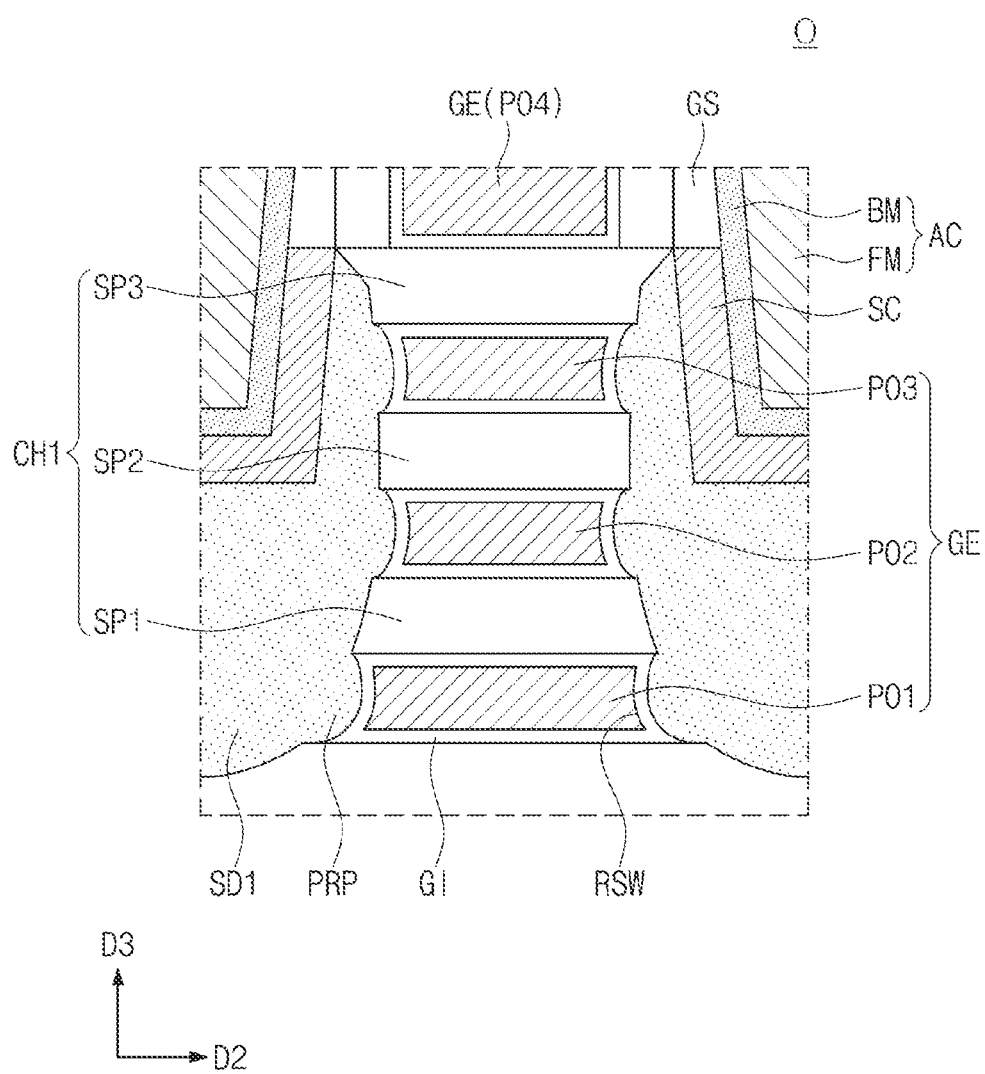
FIG. 21 is an enlarged cross-sectional view further illustrating the area 'O' indicated in FIG. 20.

FIG. 20 is a cross-sectional view taken along line A-A' of FIG. 1 and illustrates a semiconductor device according to embodiments of the inventive concept, and FIG. 21 is an enlarged cross-sectional view further illustrating the area 'O' indicated in FIG. 20. With reference to FIGS. 20 and 21, the following will discuss the gate electrode GE and the first source/drain pattern SD1 on the PMOSFET region PR.

Like the second source/drain pattern SD2, the first source/drain pattern SD1 may include protrusions PRP. The protrusions PRP may protrude in a direction from the first source/drain pattern SD1 toward the gate electrode GE. Each of the protrusions PRP may have a crooked profile. Each of the protrusions PRP may protrude toward one of the first, second, and third parts PO1, PO2, and PO3 of the gate electrode GE.

Each of the first, second, and third parts PO1, PO2, and PO3 of the gate electrode GE may include a recessed sidewall RSW. The recessed sidewall RSW may be recessed in a direction away from the first source/drain pattern SD1. The recessed sidewall RSW may adjoin and face the protrusion PRP. The recessed sidewall RSW may have a profile that conforms to that of the protrusion PRP. The gate dielectric layer GI may be interposed between the protrusion PRP and the recessed sidewall RSW.

The first, second, and third parts PO1, PO2, and PO3 of the gate electrode GE may have their widths in the second direction D2, which widths may be changed in the third direction D3. For example, width of each of the first, second, and third parts PO1, PO2, and PO3 may decrease to a minimum value and then increases again in the third direction D3.

Semiconductor devices according to the inventive concept may be configured such that no inner spacer is provided between a gate electrode and a second source/drain pattern. Therefore, a resulting parasitic capacitance may be reduced between the gate electrode and the second source/drain pattern. As a result, the semiconductor device may exhibit improved electrical characteristics.

Although the inventive concept has been described in relation to example embodiments illustrated in the accompanying drawings, it will be understood by those skilled in the art that many modifications and variations may be made thereto without departing from scope of the inventive concept, as defined by the following claims.

What is claimed is:

1. A semiconductor device, comprising:
a substrate having an active pattern;
a source/drain pattern on the active pattern of the substrate, the source/drain pattern extending to a depth below an uppermost surface of the active pattern of the substrate;
a channel pattern connected to the source/drain pattern and including semiconductor patterns spaced apart in a vertical stack over the uppermost surface of the active pattern of the substrate; and
a gate electrode extending across the channel pattern,
wherein the semiconductor patterns include a first semiconductor pattern and a second semiconductor pattern over the first semiconductor pattern,
the gate electrode includes a first part between the substrate and the first semiconductor pattern and a second part between the first semiconductor pattern and the second semiconductor pattern,
a first gate insulating layer is interposed between a lower surface of the first part and the uppermost surface of the active pattern of the substrate, and between an upper surface of the first part and a lower surface of the first semiconductor pattern,
a second gate insulating layer is interposed between a lower surface of the second part and an upper surface of the first semiconductor pattern, and between an upper surface of the second part and a lower surface of the second semiconductor pattern,
the first gate insulating layer physically contacts the lower surface of the first part and the uppermost surface of the active pattern of the substrate,
the source/drain pattern including a side wall, the side wall of the source/drain pattern including first protrusions that protrude outwardly from adjacent portions of the side wall in a direction towards the first part and second protrusions protrude outwardly from adjacent portions of the side wall in a direction towards the second part,
the first gate insulating layer includes a side wall physically contacting the first protrusions, the side wall of the first gate insulating layer including a first recess, and the first protrusions of the source/drain pattern protruding into the first recess,
the second gate insulating layer includes a side wall physically contacting the second protrusions, the side wall of the second gate insulating layer including a second recess, and the second protrusions of the source/drain pattern protruding into the second recess, and a width of the first part varies with a depth of the first part, such that a width of a middle portion of the first part is less than a width of a lower portion of the first part and a width of an upper portion of the first part.

2. The semiconductor device of claim 1, wherein the source/drain pattern is an N-type source/drain pattern and includes a bottom surface contacting the substrate at the depth below the uppermost surface of the active pattern of the substrate.

3. The semiconductor device of claim 1, wherein the first part has recessed side walls, the recessed side walls face the first protrusions, and the recessed side walls have a profile that conforms with a profile of the first protrusions.

4. The semiconductor device of claim 1, wherein the width of the lower portion is greater than the width of the upper portion.

5. The semiconductor device of claim 4, wherein a minimum width of the second part is less than the width of the middle portion of the first part.

6. The semiconductor device of claim 5, wherein the semiconductor patterns further include a third semiconductor pattern over the second semiconductor pattern,
the gate electrode further includes a third part between the second semiconductor pattern and the third semiconductor pattern, and
a minimum width of the third part is less than the minimum width of the second part.

7. The semiconductor device of claim 1, wherein each of the first part and the second part includes:
a contact segment adjacent to the source/drain pattern and having a recessed side wall; and
an extension segment extending from the contact segment in a direction away from the recessed side wall and including a protruding pattern that protrudes in a direction perpendicular to a top surface of the substrate.

8. The semiconductor device of claim 7, wherein a thickness of the contact segment is less than a thickness of the extension segment.

9. The semiconductor device of claim 1, further comprising:
an active contact coupled to the source/drain pattern and including an upper dielectric pattern; and
a gate contact coupled to the gate electrode.

10. The semiconductor device of claim 1, wherein the first gate insulating layer and the second gate insulating layer each comprise a high-k dielectric layer.

11. A semiconductor device, comprising:
a substrate having an active pattern;
an N-type source/drain pattern on the active pattern including a bottom surface contacting the substrate at a depth below an uppermost surface of the active pattern;
a channel pattern connected to the N-type source/drain pattern and including semiconductor patterns spaced apart in a vertical stack over the uppermost surface of the active pattern of the substrate, wherein the semiconductor patterns include a first semiconductor pattern and a second semiconductor pattern on the first semiconductor pattern;
a gate electrode extending across the channel pattern and including a first part between the substrate and the first semiconductor pattern; and
a gate insulating layer interposed between a lower surface of the first part and the uppermost surface of the active pattern of the substrate, wherein the gate insulating layer physically contacts the lower surface of the first part and the uppermost surface of the active pattern of the substrate,
wherein the N-type source/drain pattern includes a side wall, the side wall of the N-type source/drain pattern includes first protrusions, the first protrusions protrude from adjacent portions of the side wall in a direction toward the first part, the first part includes a recessed side wall, and the recessed side wall faces the first protrusions and has a profile that conforms to a profile of the first protrusions, and
the recessed side wall physically contacts the first protrusions, the recessed side wall of the gate insulating layer includes a recess, and the first protrusions of the N-type source/drain pattern protrude into the recess.

12. The semiconductor device of claim 11, wherein the gate electrode further includes a second part between the first semiconductor pattern and the second semiconductor pattern, and
a minimum width of the first part is greater than a minimum width of the second part.

13. The semiconductor device of claim 12, wherein each of the first part and the second part includes:
a contact segment adjacent to the N-type source/drain pattern and including a recessed side wall; and
an extension segment extending from the contact segment in a direction away from the recessed side wall, and including a protruding pattern that protrudes in a direction perpendicular to a top surface of the substrate.

14. The semiconductor device of claim 11, wherein width of the first part varies with depth of the first part, decreasing to a minimum value and then increasing as the depth extends in a direction perpendicular to a top surface of the substrate.

15. The semiconductor device of claim 14, wherein the first part includes a lower portion having a first width, a middle portion having a second width, and an upper portion having a third width greater than the second width and less than the first width.

16. A semiconductor device, comprising:
a substrate including a PMOSFET region and an NMOSFET region adjacent to one another in a first direction, the substrate including a first active pattern in the PMOSFET region and a second active pattern in the NMOSFET region;
a first source/drain pattern on the first active pattern and extending to a depth below an uppermost surface of the first active pattern of the substrate, and a first channel pattern connected to the first source/drain pattern and including a first semiconductor pattern, a second semiconductor pattern, and a third semiconductor pattern spaced apart in a first vertical stack over the uppermost surface of the first active pattern of the substrate;
a second source/drain pattern on the second active pattern and extending to a depth below an uppermost surface of the second active pattern of the substrate, and a second channel pattern on the second source/drain pattern and including the first semiconductor pattern, the second semiconductor pattern, and the third semiconductor pattern spaced apart in a second vertical stack over the uppermost surface of the second active pattern of the substrate;
a first gate electrode extending in the first direction across the first channel pattern and including a first part between the substrate and the first semiconductor pattern, a second part between the first semiconductor pattern and the second semiconductor pattern, a third part between the second semiconductor pattern and the third semiconductor pattern, and a fourth part on the third semiconductor pattern;

a second gate electrode extending in the first direction across the second channel pattern and including a first part between the substrate and the first semiconductor pattern, a second part between the first semiconductor pattern and the second semiconductor pattern, a third part between the second semiconductor pattern and the third semiconductor pattern, and a fourth part on the third semiconductor pattern;

a first gate dielectric layer between the first channel pattern and the first gate electrode, at least a portion of the first gate dielectric layer physically contacting the first gate electrode and the uppermost surface of the first active pattern of the substrate;

a second gate dielectric layer between the second channel pattern and the second gate electrode, at least a portion of the second gate dielectric layer physically contacting the second gate electrode and the uppermost surface of the second active pattern of the substrate;

a first gate spacer on a side wall of the first gate electrode;

a second gate spacer on a side wall of the second gate electrode;

a first gate capping pattern on a top surface of the first gate electrode;

a second gate capping pattern on a top surface of the second gate electrode;

a first interlayer dielectric layer on the first gate capping pattern and the second gate capping pattern;

active contacts penetrating the first interlayer dielectric layer and correspondingly coupled to the first source/drain pattern and the second source/drain pattern;

gate contacts penetrating the first interlayer dielectric layer and correspondingly coupled to the first gate electrode and the second gate electrode;

a second interlayer dielectric layer on the first interlayer dielectric layer;

a first metal layer in the second interlayer dielectric layer and including first lines correspondingly connected to the active contacts and the gate contacts;

a third interlayer dielectric layer on the second interlayer dielectric layer; and a second metal layer in the third interlayer dielectric layer and including second lines correspondingly connected to the first lines, wherein the second source/drain pattern includes a side wall, the side wall of the second source/drain pattern including first protrusions that protrude outwardly from adjacent portions of the side wall in a direction towards the first part and second protrusions that protrude outwardly from adjacent portions of the side wall in a direction towards the second part, the second gate dielectric layer includes a side wall physically contacting the second protrusions, the side wall of the second gate dielectric layer including a recess, the second protrusions of the second source/drain pattern protruding into the recess, and a width of the first part of the second gate electrode varies with a depth of the first part of the second gate electrode decreasing to a minimum value and then increasing again in a direction perpendicular to a top surface of the substrate.

17. The semiconductor device of claim 16, wherein the first part of the second gate electrode includes a recessed side wall facing the first protrusions and having a profile that conforms to a profile of the first protrusions.

18. The semiconductor device of claim 16, wherein the first part of the second gate electrode includes a lower portion having a first width, a middle portion having a second width, and an upper portion having a third width greater than the second width and less than the first width.

19. The semiconductor device of claim 18, wherein a minimum width of the second part of the second gate electrode is a fourth width less than the second width, and a minimum width of the third part of the second gate electrode is a fifth width less than the fourth width.

20. The semiconductor device of claim 16, wherein each of the first part of the second gate electrode, the second part of the second gate electrode, and the third part of the second gate electrode includes:

a contact segment adjacent to the second source/drain pattern and including a recessed side wall; and an extension segment extending from the contact segment in a direction away from the recessed side wall and including a protruding pattern that protrudes in a direction perpendicular to the top surface of the substrate.

* * * * *